United States Patent
Shimizu et al.

(10) Patent No.: US 9,170,577 B2
(45) Date of Patent: Oct. 27, 2015

(54) SEMICONDUCTOR INTEGRATED CIRCUIT AND OPERATION METHOD THEREOF

(71) Applicant: Renesas Electronics Corporation, Kawasaki-shi (JP)

(72) Inventors: Takehiro Shimizu, Kawasaki (JP); Toshio Asai, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 358 days.

(21) Appl. No.: 13/888,258

(22) Filed: May 6, 2013

(65) Prior Publication Data

US 2013/0310983 A1 Nov. 21, 2013

(30) Foreign Application Priority Data

May 16, 2012 (JP) .................................. 2012-112468

(51) Int. Cl.
*G06F 19/00* (2011.01)
*G05B 15/02* (2006.01)
*G06F 9/30* (2006.01)

(52) U.S. Cl.
CPC .............. *G05B 15/02* (2013.01); *G06F 9/3001* (2013.01); *G06F 9/30007* (2013.01)

(58) Field of Classification Search
USPC ............................... 700/121, 98, 275, 276, 94
See application file for complete search history.

(56) References Cited

U.S. PATENT DOCUMENTS

| 4,562,374 A | 12/1985 | Sashida |
| 2001/0054164 A1* | 12/2001 | Tanizaki et al. ............... 714/718 |
| 2006/0179376 A1* | 8/2006 | Asaka ........................... 714/731 |
| 2007/0147160 A1* | 6/2007 | Hanzawa et al. ........ 365/230.03 |

FOREIGN PATENT DOCUMENTS

| JP | 59-30912 B2 | 7/1984 |
| JP | 1-17353 B2 | 3/1989 |
| JP | 11-149671 A | 6/1999 |

\* cited by examiner

*Primary Examiner* — Kidest Bahta
(74) *Attorney, Agent, or Firm* — McGinn IP Law Group, PLLC

(57) ABSTRACT

It is intended to reduce the amount of computation to be performed by CPU or the required amount of storage space in a built-in memory for timing adjustment of a pulse output signal. A digital multiplying circuit in the phase arithmetic circuit of the pulse generating circuit generates a multiplication output signal by multiplying a phase angle change value in the phase adjustment data register and a count maximum value Nmax in the cycle data register. A digital dividing circuit generates a division output signal by dividing the multiplication output signal by 360 degrees of phase angle for one cycle. A digital adding circuit adds the division output signal and rise setting/fall setting count values and a subtracting circuit subtracts the division output signal from these values. The addition and subtraction generate new rise setting/fall setting count values required to delay/advance the phase by the phase angle change value.

20 Claims, 16 Drawing Sheets

FIG. 5

| PHASE ANGLE CHANGE VALUE [deg] | MULTIPLIED BY 100 | ADJUSTMENT VALUE SIGN BIT | REGISTER SETTING VALUE |
|---|---|---|---|
| +90.00° | +9000 | 0 | 2328h |
| +63.75° | +6375 | 0 | 18E7h |
| +15.14° | +1514 | 0 | 05EAh |
| +1.01° | +101 | 0 | 0065h |
| -0.01° | -1 | 1 | 8001h |
| -0.79° | -79 | 1 | 804Fh |
| -1.99° | -199 | 1 | 80C7h |
| -38.72° | -3872 | 1 | 8F20h |
| -90.00° | -9000 | 1 | A328h |

SEMICONDUCTOR INTEGRATED CIRCUIT AND OPERATION METHOD THEREOF

CROSS-REFERENCE TO RELATED APPLICATIONS

The disclosure of Japanese Patent Application No. 2012-112468 filed on May 16, 2012 including the specification, drawings and abstract is incorporated herein by reference in its entirety.

BACKGROUND

The present invention relates to a semiconductor integrated circuit and an operation method thereof and, in particular, relates to a technique that is effective for reducing the amount of computation to be performed by a central processing unit (CPU) or the required amount of storage space in a built-in memory for timing adjustment of a pulse output signal.

Lately, ultrasonic motors (USMs) or hypersonic motors (HSMs) having features such as high torque at low speed, fast response, and high positioning accuracy are used in the fields of automatic focusing control and zooming control for camera lenses, actuators of robots, and actuators of positioning devices. An ultrasonic motor produces a flexural wave motion in a vibrating body (stator) by using ultrasonic vibration generated by piezoelectric elements and drives a moving body (rotor or slider) by using a traveling wave resulting from the flexural wave motion. To transfer the traveling wave originating from the stator to the rotor, some pressurized contact is needed.

Patent Document 1 listed below describes an ultrasonic motor called a "wedge type" in which one end of the vibrating body vibrated by an ultrasonic transducer and one end face of the moving body are positioned to face each other and a plate-like or rod-like vibrating piece is inserted between both. By tilting the vibrating piece at a suitable angle, a reciprocating motion of the ultrasonic transducer is converted to a unidirectional motion of the moving body.

Besides, Patent Document 2 listed below describes an ultrasonic motor called a "traveling wave type" that produces a flexural wave motion in the stator and drives the rotor by using a traveling wave resulting from the flexural wave motion. According to this document, the moving body is brought in pressured contact with the surface of an elastic body of the ultrasonic transducer, the elastic body having a plurality of electrostrictive elements fixed thereto. Application of a high-frequency voltage with different phases in time to the electrostrictive elements being in parallel produces a traveling wave generating elliptical vibration on the surface of the elastic body of the ultrasonic transducer, thus driving the moving body by friction drive. Thereby, this provides a solution to the drawbacks of the "wedge type" ultrasonic motor described in Patent Document 1 listed below, that is, its durability and limitation of its rotational direction to one direction.

Moreover, in FIG. 8 in Patent Document 3 listed below and its related disclosure, there is described a pulse generator comprised of one delay circuit, six inverters, three latch circuits, six AND circuits, one OR circuit, and one selector. The delay circuit responding to a pulse input signal generates a 1st delayed pulse output signal which is delayed by a ⅙ period of one cycle of the pulse input signal (delayed by a phase of 60 degrees) and a 2nd delayed pulse output signal which is delayed by a ⅖ period of one cycle of the pulse input signal (delayed by a phase of 120 degrees). The pulse input signal is supplied to the input terminals of a 1st inverter and a 4th inverter, the 1st delayed pulse output signal is supplied to the input terminals of a 2nd inverter and a 5th inverter, and the 2nd delayed pulse output signal is supplied to the input terminals of a 3rd inverter and a 6th inverter.

An output signal of the 4th inverter, an output signal of the 5th inverter, and an output signal of the 6th inverter are supplied to 1st, 2nd, and 3rd S input terminals of a 1st latch circuit, respectively. The pulse input signal, the 1st delayed pulse output signal, and the 2nd delayed pulse output signal are supplied to 1st, 2nd, and 3rd S input terminals of a 2nd latch circuit, respectively. The input terminal and output terminal of the 1st inverter are coupled to a 1st input terminal of a 1st AND circuit and a 1st input terminal of a 2nd AND circuit, respectively. The input terminal and output terminal of the 2nd inverter are coupled to a 1st input terminal of a 3rd AND circuit and a 1st input terminal of a 4th AND circuit, respectively. The input terminal and output terminal of the 3rd inverter are coupled to a 1st input terminal of a 5th AND circuit and a 1st input terminal of a 6th AND circuit, respectively.

A 1st Q output terminal of the 1st latch circuit and a 1st Q output terminal of the 2nd latch circuit are coupled to a 2nd input terminal of the 1st AND circuit and a 2nd input terminal of the 2nd AND circuit, respectively. A 2nd Q output terminal of the 1st latch circuit and a 2nd Q output terminal of the 2nd latch circuit are coupled to a 2nd input terminal of the 3rd AND circuit and a 2nd input terminal of the 4th AND circuit, respectively. Further, a 3rd Q output terminal of the 1st latch circuit and a 3rd Q output terminal of the 2nd latch circuit are coupled to a 2nd input terminal of the 5th AND circuit and a 2nd input terminal of the 6th AND circuit, respectively.

The input terminal and output terminal of the 1st inverter, the input terminal and output terminal of the 2nd inverter, and the input terminal and output terminal of the 3rd inverter are coupled to 1st, 2nd, 3rd, 4th, 5th, and 6th input terminals of the selector, respectively. An output terminal of the 1st AND circuit, an output terminal of the 2nd AND circuit, and an output terminal of the 3rd AND circuit are coupled to 1st, 2nd, and 3rd input terminals of the OR circuit, respectively. An output terminal of the 4th AND circuit, an output terminal of the 5th AND circuit, and an output terminal of the 6th AND circuit are coupled to 4th, 5th, and 6th input terminals of the OR circuit, respectively.

The 1st Q output terminals, 2nd Q output terminals, and 3rd Q output terminals of the 1st and 2nd latch circuits are coupled to 1st, 2nd, 3rd, 4th, 5th, and 6th input terminals of a third latch circuit, respectively. An output terminal of the OR circuit is coupled to a sync input terminal of the 3rd latch circuit and a pulse select signal is generated which is supplied from an output terminal of the 3rd latch circuit to the selector.

Six pulse input signals with their phases shifted 60 degrees from each other are supplied to 1st, 2nd, 3rd, 4th, 5th, and 6th input terminals of the selector. Thereby, one selected pulse input signal out of the six pulse input signals can be output as an output signal from an output terminal of the selector.

RELATED ART DOCUMENTS

Patent Documents

[Patent Document 1] Japanese Published Examined Patent Application No. Sho 59 (1984)-30912
[Patent Document 2] Japanese Published Examined Patent Application No. Hei 1 (1989)-17353

[Patent Document 3] Japanese Published Unexamined Patent Application No. Hei 11 (1999)-149671

SUMMARY

In advance of the present invention, the present inventors engaged in development of a semiconductor integrated circuit capable of driving a traveling wave type ultrasonic motor discussed in the beginning. This semiconductor integrated circuit for driving the ultrasonic motor required a function to adjust the phase of a drive pulse that is supplied to the ultrasonic motor. Because there is a need for driving the ultrasonic motor at high accuracy, drive pulse phase adjustment at high accuracy is required.

The pulse generator described in FIG. 8 in Patent Document 3 above and its related disclosure selects one of six pulse input signals with their phases shifted from each other by 60 degrees as an output signal. In advance of this invention, an approach based on FIG. 8 in Patent Document 3 above and its related disclosure was examined by the present inventors. This approach is to select one of a huge number of pulse input signals with a reduced amount of phase shift from each other as an output signal. However, in a case that this approach was adopted, a problem of an increase in the circuit size and power consumption of the pulse generator was found out by the examination made by the present inventors in advance of the present invention.

FIG. 14 is a diagram depicting a configuration of a drive pulse output generating circuit 1g examined by the present inventors et al. in advance of the present invention.

The drive pulse output generating circuit 1g examined by the present inventors et al. in advance of the present invention, depicted in FIG. 14, generates drive pulse output signals for driving a traveling wave type ultrasonic motor that is coupled to an output terminal Tout.

As depicted in FIG. 14, the drive pulse output generating circuit 1g examined by the present inventors et al. in advance of the present invention is configured with a 1st register 10 for rise setting, a 2nd register 11 for fall setting, a 3rd register 12 for setting cycle data, a 3rd flip-flop (FF) 13, and a counter 14. The drive pulse output generating circuit 1g is further configured with a 1st flip-flop (FF) 15, a 2nd flip-flop (FF) 16, a 1st comparator 17, a 2nd comparator 18, and a pulse generator 19.

The counter 14 is configured to count up a 16-bit counter value in response to a clock signal which is not depicted. More specifically, a count initial value Nmini for the counter 14 to count up from it is set to, for example, 0 and a count maximum value Nmax for the counter 14 to count up to it can be set by cycle data that is set in the 3rd register 12.

Thus, the counter 14 starts to count up from the count initial value Nmini set to 0 and executes count up. When its counter value has reached the count maximum value Nmax set by cycle data held by the 3rd register 12, the counter value returns to the count initial value Nmini of 0 again and the counter executes count up in response to the clock signal.

Cycle data that is set in the 3rd register 12 is 16 bits, 16-bit data can be stored in the 3rd flip-flop (FF) 13, and the counter value of the counter 14 is also 16 bits. Thus, 16-bit data can be stored in the 1st flip-flop (FF) 15 and the 2nd flip-flop (FF) 16 respectively. The 1st comparator 17 and the 2nd comparator 18 detect a match or mismatch between two input signals of 16 bit data.

A counter value of the counter 14 for rise setting, which was set in the 1st register 10, is stored into the 1st flip-flop (FF) 15 in response to an update enable signal. A counter value of the counter 14 for fall setting, which was set in the 2nd register 11, is stored into the 2nd flip-flop (FF) 16 in response to the update enable signal. Further, the count maximum value Nmax that is set by cycle data which was set in the 3rd register 12 is stored into the 3rd flip-flop (FF) 13 in response to the update enable signal.

While the counter 14 executes count up, starting from the count initial value Nmini of 0, it is detected by the 1st comparator 17 that a match occurs between a counter value output by the counter 14 and a rise setting value stored in the 1st flip-flop (FF) 15. Rise command information is generated from an output terminal of the 1st comparator 17. In response to the rise command information, the pulse generator 19 makes a drive pulse output signal at its output terminal Tout change from a low level to a high level.

While the counter 14 continues to count up, it is detected by the 2nd comparator 18 that a match occurs between a counter value output by the counter 14 and a fall setting value stored in the 2nd flip-flop (FF) 16. Fall command information is generated from an output terminal of the 2nd comparator 18. In response to the fall command information, the pulse generator 19 makes a drive pulse output signal at its output terminal Tout change from the high level to the low level.

While the counter 14 further continues to count up, when a counter value output by the counter 14 has reached the count maximum value Nmax which was set by cycle data held by the 3rd flip-flop (FF) 13, the counter value returns to the count initial value Nmini of 0 again and the counter executes count up in response to the clock signal.

FIG. 15 is a diagram for explaining operation of the drive pulse output generating circuit 1g examined by the present inventors et al. in advance of the present invention, depicted in FIG. 14.

FIG. 15 illustrates behavior of the counter 14 starting from the count initial value Nmini and counting up to the count maximum value Nmax.

FIG. 15 further illustrates behavior of a drive pulse output signal at the output terminal Tout of the pulse generator 19, the signal changing from the low level to the high level by a match occurring between a counter value output by the counter 14 and a rise setting value stored in the 1st flip-flop (FF) 15.

FIG. 15 further illustrates behavior of the drive pulse output signal at the output terminal Tout of the pulse generator 19, the signal changing from the high level to the low level by a match occurring between a counter value output by the counter 14 and a fall setting value stored in the 2nd flip-flop (FF) 16.

Meanwhile, as mentioned previously, in order to drive the ultrasonic motor at high accuracy, drive pulse phase adjustment at high accuracy is required. Consequently, it is needed to adjust timing at which the drive pulse output signal at the output terminal Tout of the pulse generator 19 changes from the low level to the high level and timing at which the drive pulse output signal changes from the high level to the low level.

Meanwhile, while the counter value of the counter 14 starts from the count initial value Nmini of 0 and reaches the count maximum value Nmax, one cycle of 360 degrees elapses, during which the drive pulse output signal at the output terminal Tout of the pulse generator 19 changes from the low level to the high level and further changes from the high level to the low level. Therefore, in order to adjust the changing timings of the drive pulse output signal, it is needed to change the phase angles of the changing timings within one cycle of 360 degrees.

FIG. 16 is a diagram explaining a procedure for calculating a rise setting value and a fall setting value as counter values of the counter 14 for adjustment of changing timing of a drive pulse output signal for the ultrasonic motor in the drive pulse output generating circuit 1g examined by the present inventors et al. in advance of the present invention, depicted in FIG. 14.

A first step S100 presented in FIG. 16 is to divide the count maximum value MAX as a counter value of the counter 14, which corresponds to cycle data that was set in the 3rd register 12, by 360 degrees of phase angle for one cycle. At this point, the counter value of the counter 14 is represented by a binary number of 16 bits. By the division at step S100, a changed counter value of the counter 14, which changes per degree of phase angle to be changed, is calculated.

A next step S200 presented in FIG. 16 is to multiply the changed counter value of the counter 14, which changes per degree of phase angle to be changed, calculated at the first step S100, and a phase angle change value for drive output signal changing timing adjustment. At this point, the phase angle change value is represented by a decimal number. By the multiplication at step S200, a changed counter value of the counter 14 required for desired phase angle change is calculated. This counter value of the counter 14 is also represented by a binary number of 16 bits.

A further step S300 presented in FIG. 16 performs addition of the changed counter value of the counter 14 required for desired phase angle change, calculated at step S200, and a counter setting value of the counter 14 for rise setting, which is now set in the 1st register 10 before phase angle change. Moreover, this step S300 performs addition of the changed counter value of the counter 14 required for desired phase angle change, calculated at step S200, and a counter setting value of the counter 14 for fall setting, which is now set in the 2nd register 11 before phase angle change. Thus, by the addition at step S300, for the counter 14, a new rise setting counter value and a new fall setting counter value required for desired changing timing adjustment of a drive pulse output signal are calculated.

However, in the approach examined by the present inventors et al. in advance of the present invention, discussed with FIGS. 14 to 16, a problem in which the amount of computation to be performed by a central processing unit (CPU) mounted in the semiconductor integrated circuit increases or the required amount of storage space in a built-in memory mounted in the semiconductor integrated circuit increases was also found out by the examination made by the present inventors in advance of the present invention. More specifically, because the calculation procedure illustrated in FIG. 16 includes division and multiplication, it follows that the amount of computation to be performed by the CPU in the semiconductor integrated circuit increases. Besides, because software for carrying out the calculation procedure illustrated in FIG. 16 including division and multiplication through computation by the CPU in the semiconductor integrated circuit has to be stored in the built-in memory which is mounted in the semiconductor integrated circuit 1, it follows that the required amount of storage space in the built-in memory increases.

Means and the like for solving the above-mentioned problem will be described hereinafter. Other problems and novel features will become apparent from the following description in the present specification and the accompanying drawings.

An exemplary embodiment disclosed herein is briefly outlined below.

A pulse generating circuit (1g) in a semiconductor integrated circuit (1) according to an exemplary embodiment includes a phase adjustment data register (1B), a cycle data register (12), a phase arithmetic circuit (1A), a counter (14), and a pulse generator (19).

The phase arithmetic circuit (1A) in the pulse generating circuit (1g) includes a digital multiplying circuit (100), a digital dividing circuit (101), and digital adding and subtracting circuits (102, 103).

The digital multiplying circuit (100) generates a multiplication output signal by performing multiplication of a phase angle change value stored in the phase adjustment data register (1B) and a count maximum value (Nmax) stored in the cycle data register (12).

The digital dividing circuit (101) generates a division output signal by dividing the multiplication output signal from the digital multiplying circuit (100) by a phase angle (360 degrees) for one cycle.

The digital adding circuit (102) performs adding the division output signal from the digital dividing circuit (101) and a rise setting count value stored in the rise setting register (10) as well as adding the division output signal and a fall setting count value stored in the fall setting register (11). The subtracting circuit (103) performs subtracting the division output signal from the rise setting count value as well as subtracting the division output signal from the fall setting count value.

It is featured that the addition and subtraction performed by the digital adding and subtracting circuits generate a new rise setting count value and a new fall setting count value required to delay and advance the phase by the phase angle change value (see FIG. 2).

An advantageous effect that will be achieved by an exemplary one of embodiments disclosed herein is briefly described below.

According to the present semiconductor integrated circuit (1), it is possible to reduce the amount of computation to be performed by the central processing unit (CPU) or the required amount of storage space in a built-in memory for timing adjustment of a pulse output signal.

BRIEF DESCRIPTION OF THE DRAWINGS

FIG. 5 is a diagram explaining register setting values corresponding to phase angle change values settable in the phase adjustment data register (4th register) 1B of the phase arithmetic circuit 1A in the semiconductor integrated circuit 1 of the first embodiment depicted in FIG. 2.

DETAILED DESCRIPTION

1. General Outline of Embodiments

Figure 1:
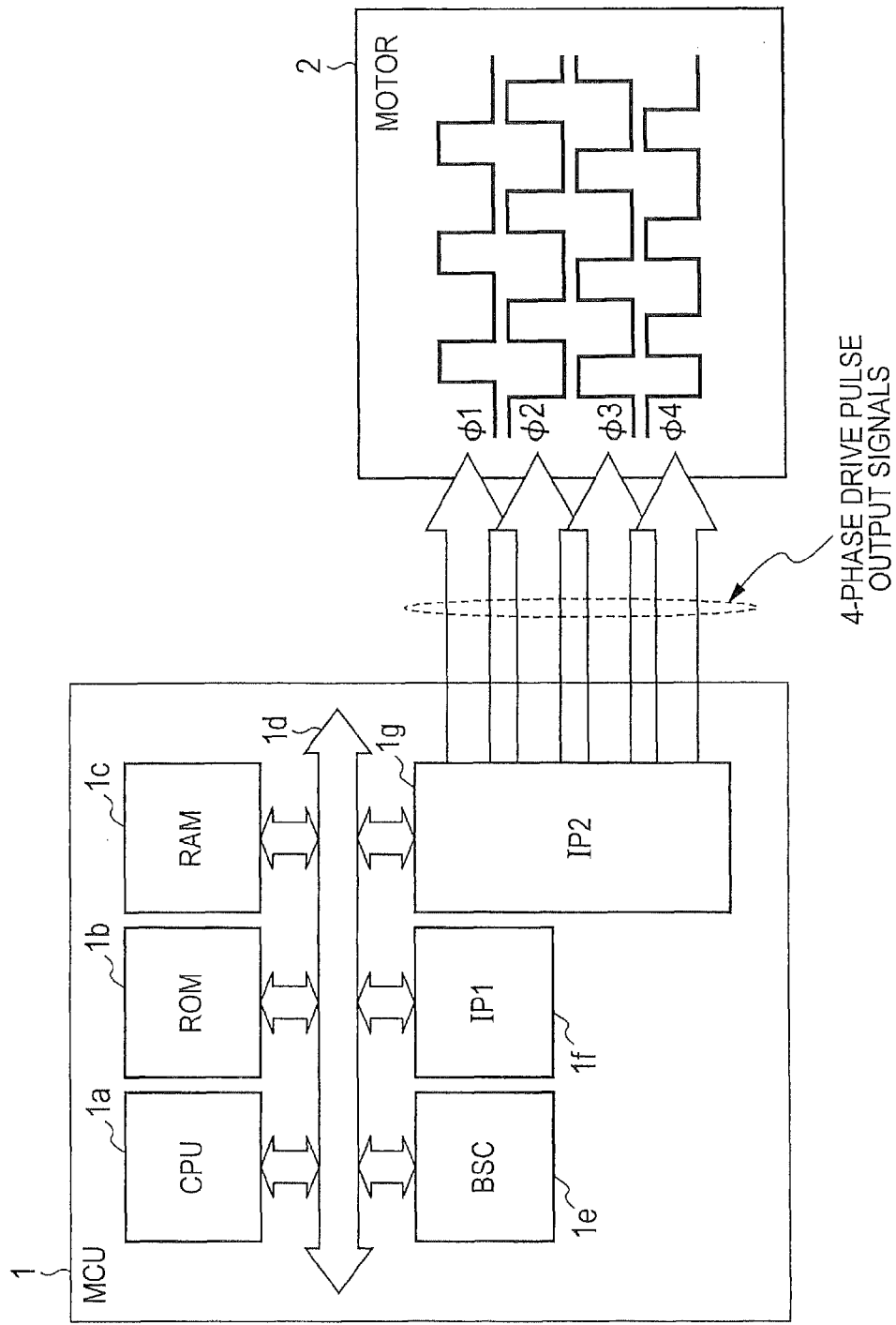
FIG. 1 is a diagram depicting a configuration of a semiconductor integrated circuit 1 according to a first embodiment for driving a traveling wave type ultrasonic motor 2.

To begin with, exemplary embodiments of the present invention disclosed herein are outlined. In the following general description of exemplary embodiments, reference designators (numerals) in the drawings, which are given for referential purposes in parentheses, are only illustrative of elements that fall in the concepts of the components identified by the designators.

[1] A semiconductor integrated circuit (1) according to an exemplary embodiment includes a central processing unit (1a), a built-in memory (1b, 1c), and a pulse generating circuit (1g) (see FIG. 1).

The pulse generating circuit (1g) includes a rise setting register (10), a fall setting register (11), a phase adjustment data register (1E), a cycle data register (12), a phase arithmetic circuit (1A), a counter (14), a 1st comparator (17), a 2nd comparator (18), and a pulse generator (19).

The counter (14) starts to count up, incrementing its count value from a count initial value (Nmini).

The cycle data register (12) stores, as cycle data, a count maximum value (Nmax) for the counter to count up to it.

When the count value of the counter (14) has reached the count maximum value after the counter (14) starts to count up from the count initial value, the count value of the counter (14) returns to the count initial value again and the counter (14) restarts to count up.

The rise setting register (10) stores a rise setting count value of the counter (14) to make a pulse output signal being generated by the pulse generator (19) rise from a low level to a high level.

The fall setting register (11) stores a fall setting count value of the counter (14) to make a pulse output signal being generated by the pulse generator (19) fall from the high level to the low level.

In response to detection of a match occurring between the count value of the counter and the rise setting count value, detected by the 1st comparator, the pulse generator makes the pulse output signal change from the low level to the high level.

In response to detection of a match occurring between the count value of the counter and the fall setting count value, detected by the 2nd comparator, the pulse generator makes the pulse output signal change from the high level to the low level.

The phase adjustment data register (1B) stores a phase angle change value for timing adjustment of the pulse output signal which is generated by the pulse generator (19).

The phase arithmetic circuit (1A) in the pulse generating circuit (1g) includes a digital multiplying circuit (100), a digital dividing circuit (101), a digital adding circuit (102), and a digital subtracting circuit (103).

Figure 3:
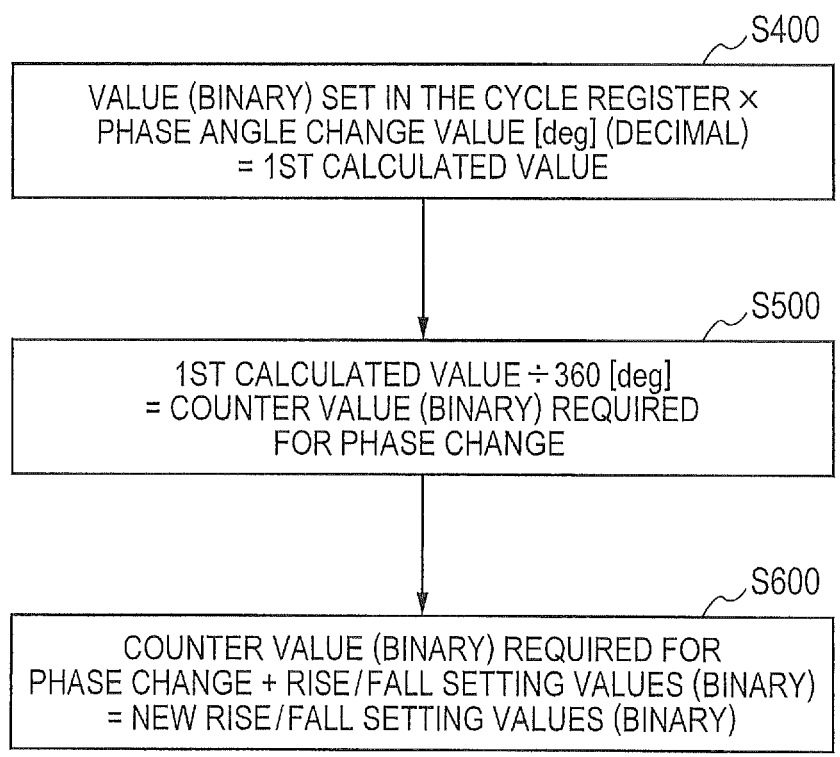
FIG. 3 is a diagram explaining a procedure for calculating a rise setting value and a fall setting value as counter values of the counter 14 for adjustment of changing timing of a drive pulse output signal for an ultrasonic motor in the semiconductor integrated circuit 1 according to the first embodiment depicted in FIG. 2.

The digital multiplying circuit (100) generates a multiplication output signal by performing multiplication of the phase angle change value stored in the phase adjustment data register (1B) and the count maximum value (Nmax) stored in the cycle data register (12) (FIG. 3; S400).

The digital dividing circuit (101) generates a division output signal by dividing the multiplication output signal from the digital multiplying circuit (100) by a phase angle (360 degrees) for one cycle (FIG. 3; S500).

The digital adding circuit (102) is capable of adding the division output signal from the digital dividing circuit (101) and the rise setting count value stored in the rise setting register (10) as well as adding the division output signal and the fall setting count value stored in the fall setting register (11) (FIG. 3; S600).

The addition performed by the digital adding circuit generates a new rise setting count value and a new fall setting count value required to delay the phase by the phase angle change value.

The digital subtracting circuit (103) is capable of subtracting the division output signal from the digital dividing circuit (101) from the rise setting count value stored in the rise setting register (10) as well as subtracting the division output signal from the fall setting count value stored in the fall setting register (11) (FIG. 3; S600).

Figure 2:
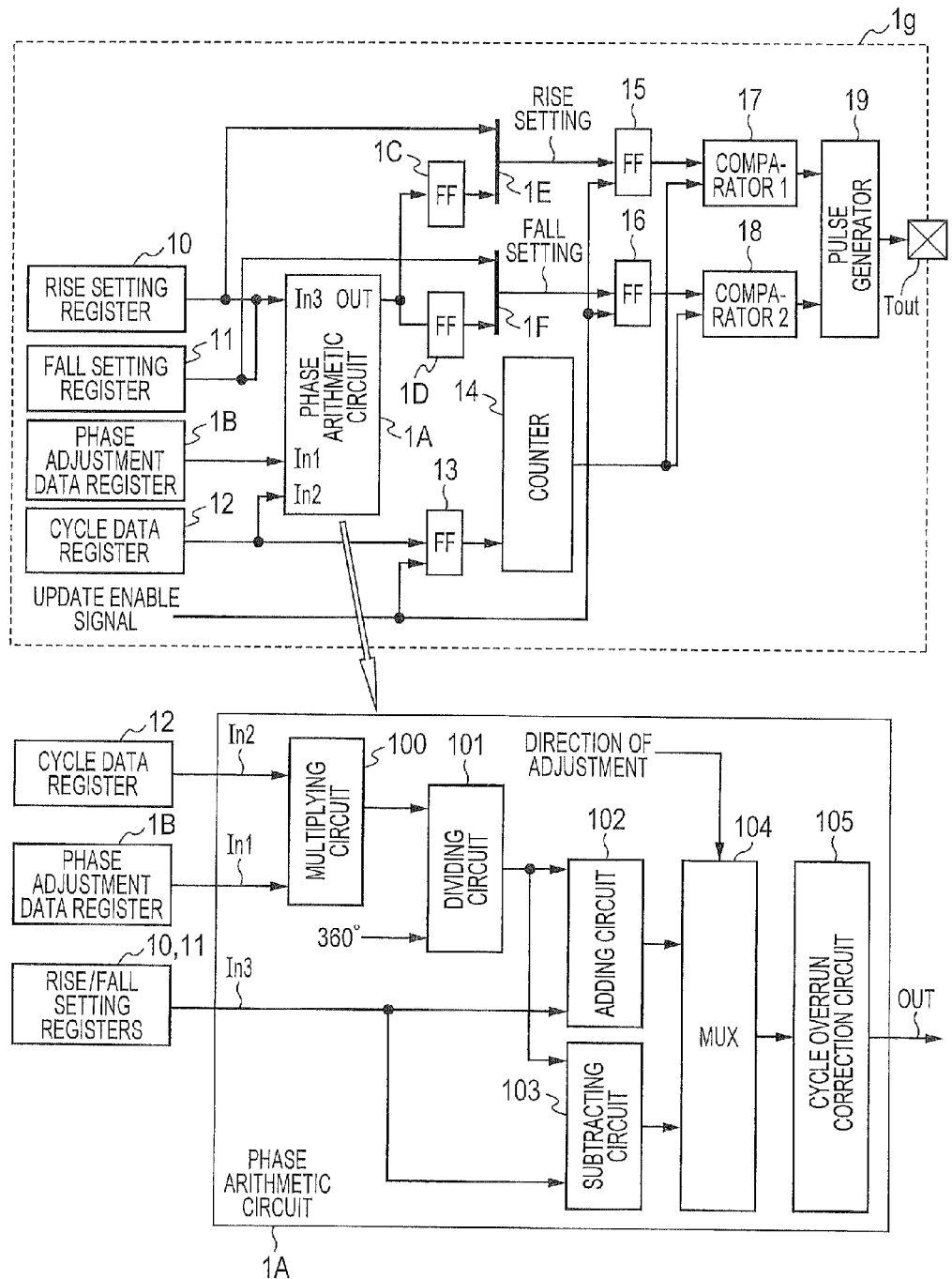
FIG. 2 is a diagram depicting a configuration of a drive pulse output generating circuit which is a second functional module 1g in the semiconductor integrated circuit 1 according to the first embodiment depicted in FIG. 1.

It is featured that the subtraction performed by the digital subtracting circuit generates a new rise setting count value and a new fall setting count value required to advance the phase by the phase angle change value (see FIG. 2).

According to the embodiment described above, it is possible to reduce the amount of computation to be performed by the central processing unit (CPU) or the required amount of storage space in a built-in memory for timing adjustment of a pulse output signal.

In a preferable embodiment, it is featured that the pulse output signal being generated by the pulse generator (19) is capable of driving a motor (2) (see FIG. 1).

In another preferable embodiment, it is featured that the motor (2) drivable by the pulse output signal being generated by the pulse generator (19) is an ultrasonic motor (see FIG. 1).

In a further preferable embodiment, it is featured that, when an addition output signal resulting from the addition performed by the digital adding circuit (102) becomes larger than the count maximum value (Nmax), the digital adding circuit (102) generates a corrected addition output signal by subtracting the count maximum value from the addition output signal (see FIG. 2).

In a more preferable embodiment, it is featured that, when a subtraction output signal resulting from the subtraction performed by the digital subtracting circuit (103) becomes smaller than the count initial value (Nmini), the digital subtracting circuit generates a corrected subtraction output signal corresponding to an absolute value of the subtraction output signal (see FIG. 2).

In another more preferable embodiment, the phase arithmetic circuit (1A) in the pulse generating circuit further includes a multiplexer (104) and a cycle overrun correction circuit (105).

The addition output signal from the digital adding circuit and the subtraction output signal from the digital subtracting circuit are supplied to a 1st input terminal and a 2nd input terminal of the multiplexer (104) respectively.

An output signal of the multiplexer (104) is input to an input terminal of the cycle overrun correction circuit (105).

It is featured that the cycle overrun correction circuit (105) has a data correction function to avoid that a low-level or high-level pulse period of the pulse output signal being generated by the pulse generator (19) in response to an arithmetic output signal from an output terminal (OUT) of the phase arithmetic circuit (1A) exceeds the one cycle of the phase angle (360 degrees) (see FIG. 2).

In a further more preferable embodiment, the pulse generating circuit (1g) further includes a 1st selector (1E), a 2nd selector (1F), a 1st flip-flop (15), a 2nd flip-flop (16), a 3rd flip-flop (10), and a 4th flip-flop (1D).

The new rise setting count value is supplied from the output terminal (OUT) of the phase arithmetic circuit (1A) to an input terminal of the 3rd flip-flop (1C) and the new fall setting count value is supplied from the output terminal (OUT) of the phase arithmetic circuit (1A) to an input terminal of the 4th flip-flop (1D).

The rise setting count value stored in the rise setting register (10) and the fall setting count value stored in the fall setting register (11) can be supplied to a 1st input terminal of the 1st selector (1E) and a 1st input terminal of the 2nd selector (1F) respectively.

The new rise setting count value from an output terminal of the 3rd flip-flop (1C) and the new fall setting count value from an output terminal of the 4th flip-flop (1D) can be supplied to a 2nd input terminal of the 1st selector (1E) and a 2nd input terminal of the 2nd selector (1F) respectively.

The rise setting count value stored in the rise setting register (10) and the new rise setting count value from the output terminal of the 3rd flip-flop (1C), which are output to an output terminal of the 1st selector (1E), can be supplied to an input terminal of the 1st flip-flop (15).

The fall setting count value stored in the fall setting register (11) and the new fall setting count value from the output terminal of the 4th flip-flop (1D), which are output to an output terminal of the 2nd selector (1F), can be supplied to an input terminal of the 2nd flip-flop (16).

An output terminal of the 1st flip-flop (15) and an output terminal of the 2nd flip-flop (16) are coupled to a 1st input terminal of the 1st comparator (17) and a 1st input terminal of the 2nd comparator (18) respectively.

It is featured that the count value of the counter (14) is supplied to a 2nd input terminal of the 1st comparator (17) and a 2nd input terminal of the 2nd comparator (18) (see FIG. 2).

In another more preferable embodiment, it is featured that the phase angle change value given in hexadecimal having a sign bit as the most significant bit is stored in the phase adjustment data register (1B) (see FIG. 5).

In a further more preferable embodiment, it is featured that the central processing unit (1a) stores the phase angle change value given in hexadecimal into the phase adjustment data register (1B) by executing control software for the motor (2) stored in the built-in memory (1b, 1c) (see FIG. 2).

In a concrete embodiment, the pulse generating circuit (1g) further includes a 5th flip-flop (13).

The count maximum value (Nmax) stored in the cycle data register (12) is supplied to an input terminal of the 5th flip-flop (13) and an output terminal of the 5th flip-flop is coupled to the counter (14).

It is featured that, in response to an update enable signal, when having been supplied to a control terminal of each of the 1st, 2nd, and 5th flip-flops (15, 16, 13), the 1st, 2nd, and 5th flip-flops stores a setting value from the output terminal of the 1st selector (1E), a setting value from the output terminal of the 2nd selector (1F), and a setting value in the cycle data register (12), respectively (see FIG. 2).

In another concrete embodiment, the pulse generating circuit (1g) further includes an AND circuit (1I) and an update timing control circuit (1J).

The update enable signal is transferred via a 1st input terminal and an output terminal of the AND circuit (1I) to the control terminal of each of the 1st, 2nd, and 5th flip-flops (15, 16, 13).

An output signal of the 1st comparator (17) and an output signal of the 2nd comparator (18) are supplied to a 1st input terminal and a 2nd input terminal of the update timing control circuit (1J) respectively.

An output signal of the 1st flip-flop (15), an output signal of the 2nd flip-flop (16), and an output signal of the 3rd flip-flop (13) are supplied to a 3rd input terminal, a 4th input terminal, and a 5th input terminal of the update timing control circuit (1J) respectively.

Figure 7:
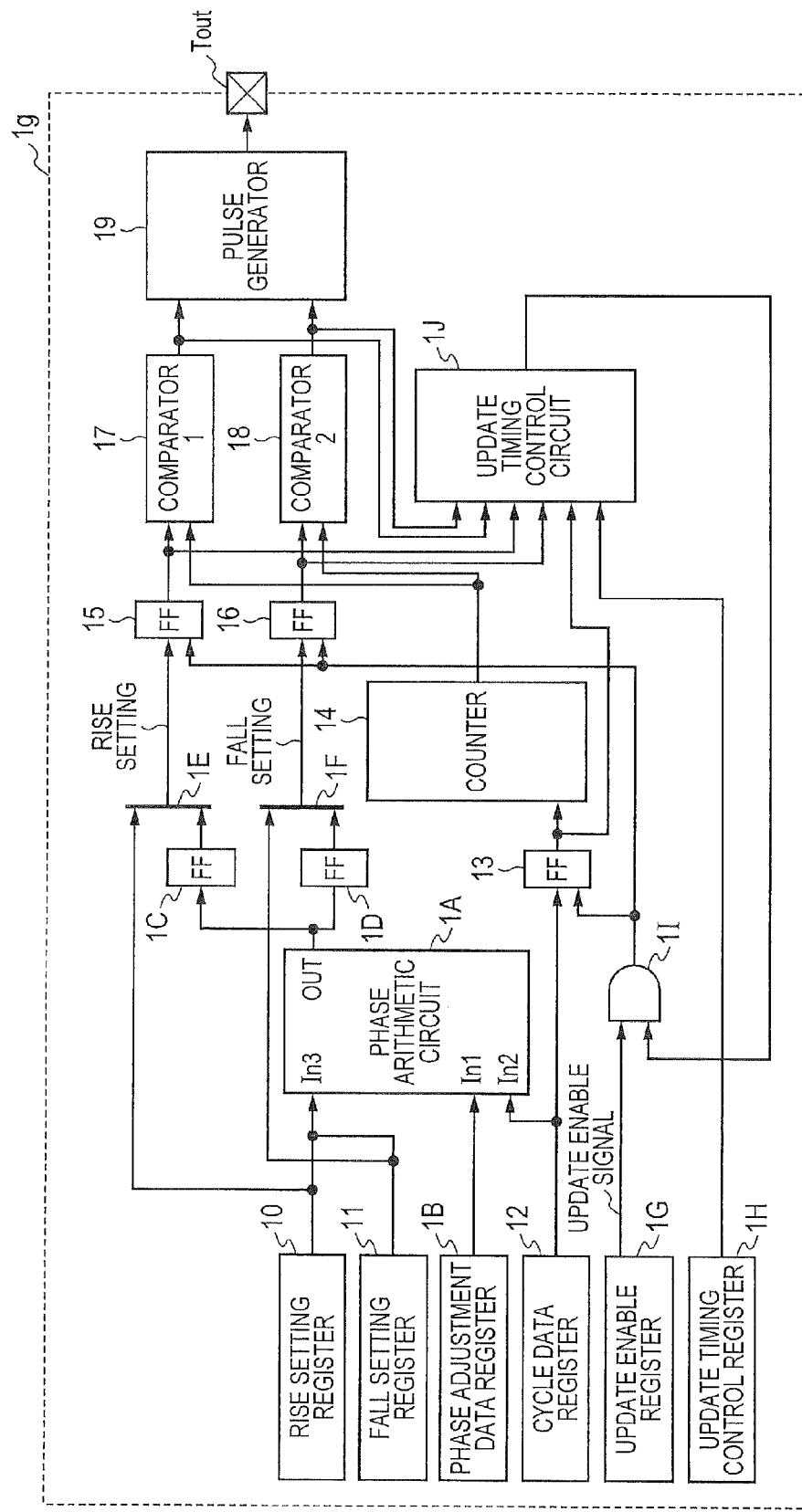
FIG. 7 is a diagram depicting another configuration of a drive pulse output generating circuit which is a second functional module 1g of a semiconductor integrated circuit 1 according to a second embodiment.

It is featured that the update timing control circuit (1J) generates a mask signal that is supplied to a 2nd input terminal of the AND circuit (1I) and the mask signal prevents the pulse output signal being generated by the pulse generator (19) from having an abnormally long high-level period and an abnormally short low-level period (see FIG. 7).

In a most concrete embodiment, the pulse generating circuit (1g) further includes a 2nd rise setting register (10_2), a 2nd fall setting register (11_2), a 3rd comparator (17_2), a 4th comparator (18_2), and a 2nd pulse generator (19_2).

The 2nd rise setting register (102) stores a 2nd rise setting count value of the counter (14) to make a 2nd pulse output signal being generated by the 2nd pulse generator (192) rise from a low level to a high level.

The 2nd fall setting register (11_2) stores a 2nd fall setting count value of the counter (14) to make a 2nd pulse output signal being generated by the 2nd pulse generator (19_2) fall from the high level to the low level.

In response to detection of a match occurring between the count value of the counter and the 2nd rise setting count value, detected by the 3rd comparator, the 2nd pulse generator makes the 2nd pulse output signal change from the low level to the high level.

Figure 13:
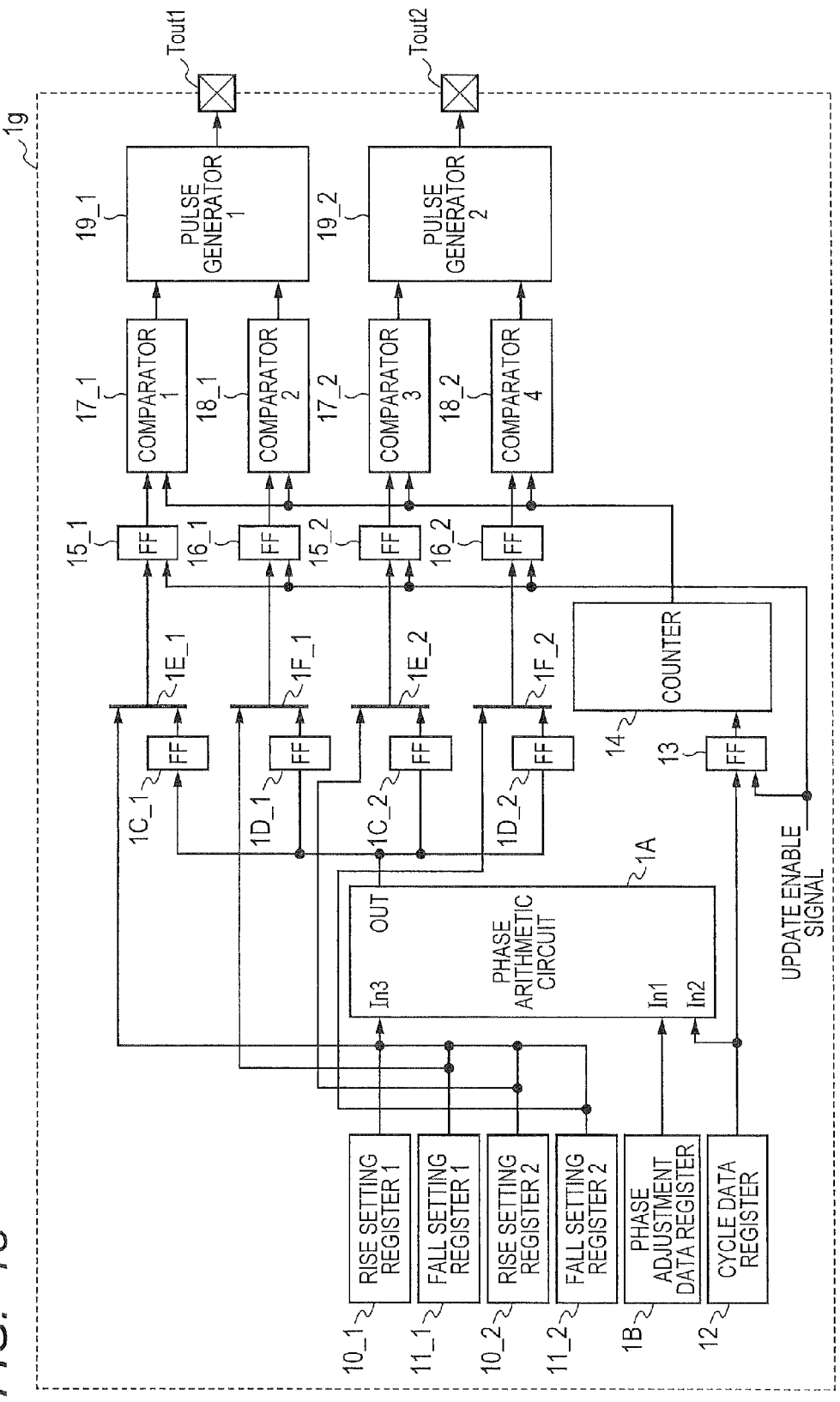
FIG. 13 is a diagram depicting a further configuration of a drive pulse output generating circuit which is a second functional module 1g of a semiconductor integrated circuit 1 according to a third embodiment.

It is featured that, in response to detection of a match occurring between the count value of the counter and the 2nd fall setting count value, detected by the 4th comparator, the 2nd pulse generator makes the 2nd pulse output signal change from the high level to the low level (FIG. 13).

[2] An exemplary embodiment in another aspect is an operation method of a semiconductor integrated circuit (1) including a central processing unit (1a), a built-in memory (1b, 1c), and a pulse generating circuit (1g).

The pulse generating circuit (1g) includes a rise setting register (10), a fall setting register (11), a phase adjustment data register (1B), a cycle data register (12), a phase arithmetic circuit (1A), a counter (14), a 1st comparator (17), a 2nd comparator (18), and a pulse generator (19).

The counter (14) starts to count up, incrementing its count value from a count initial value (Nmini).

The cycle data register (12) stores, as cycle data, a count maximum value (Nmax) for the counter to count up to it.

When the count value of the counter (14) has reached the count maximum value after the counter (14) starts to count up from the count initial value, the count value of the counter (14) returns to the count initial value again and the counter (14) restarts to count up.

The rise setting register (10) stores a rise setting count value of the counter (14) to make a pulse output signal being generated by the pulse generator (19) rise from a low level to a high level.

The fall setting register (11) stores a fall setting count value of the counter (14) to make a pulse output signal being generated by the pulse generator (19) fall from the high level to the low level.

In response to detection of a match occurring between the count value of the counter and the rise setting count value, detected by the 1st comparator, the pulse generator makes the pulse output signal change from the low level to the high level.

In response to detection of a match occurring between the count value of the counter and the fall setting count value, detected by the 2nd comparator, the pulse generator makes the pulse output signal change from the high level to the low level.

The phase adjustment data register (1B) stores a phase angle change value for timing adjustment of the pulse output signal which is generated by the pulse generator (19).

The phase arithmetic circuit (1A) in the pulse generating circuit (1g) includes a digital multiplying circuit (100), a digital dividing circuit (101), a digital adding circuit (102), and a digital subtracting circuit (103).

The digital multiplying circuit (100) generates a multiplication output signal by performing multiplication of the phase angle change value stored in the phase adjustment data register (1B) and the count maximum value (Nmax) stored in the cycle data register (12) (FIG. 3; S400).

The digital dividing circuit (101) generates a division output signal by dividing the multiplication output signal from the digital multiplying circuit (100) by a phase angle (360 degrees) for one cycle (FIG. 3; S500).

The digital adding circuit (102) is capable of adding the division output signal from the digital dividing circuit (101) and the rise setting count value stored in the rise setting register (10) as well as adding the division output signal and the fall setting count value stored in the fall setting register (11) (FIG. 3; S600).

The addition performed by the digital adding circuit generates a new rise setting count value and a new fall setting count value required to delay the phase by the phase angle change value.

The digital subtracting circuit (103) is capable of subtracting the division output signal from the digital dividing circuit (101) from the rise setting count value stored in the rise setting register (10) as well as subtracting the division output signal from the fall setting count value stored in the fall setting register (11) (FIG. 3; S600).

It is featured that the subtraction performed by the digital subtracting circuit generates a new rise setting count value and a new fall setting count value required to advance the phase by the phase angle change value (see FIG. 2).

According to the embodiment described above, it is possible to reduce the amount of computation to be performed by the central processing unit (CPU) or the required amount of storage space in a built-in memory for timing adjustment of a pulse output signal.

2. Details on Embodiments

Embodiments will then be described in greater detail. In all drawings for explaining preferred embodiments for implementing the invention, a component having the same function as the component in a previous drawing is assigned the same reference designator and its repeated description is omitted.

First Embodiment

Configuration of a Semiconductor Integrated Circuit

FIG. 1 is a diagram depicting a configuration of a semiconductor integrated circuit 1 according to a first embodiment for driving a traveling wave type ultrasonic motor 2.

As depicted in FIG. 1, the semiconductor integrated circuit 1 configured as a microcontroller unit (MCU) includes a central processing unit (CPU) 1a, a read only memory (ROM) 1b, a random access memory (RAM) 1c, an internal high-speed bus 1d, a bus controller 1e, a first functional module 1f, and a second functional module 1g.

The central processing unit (CPU) 1a implements various functions of the semiconductor integrated circuit 1 by executing software stored in the read only memory (ROM) 1b. This read only memory (ROM) 1b may be, for example, an on-chip flash non-volatile memory.

The random access memory (RAM) 1c is accessed by the central processing unit (CPU) 1a via the internal high-speed bus 1d and serves as a working storage area for the central processing unit (CPU) 1a.

The bus controller 1e serves as a device that hides access latency when the central processing unit (CPU) 1a accesses an external device coupled to an external bus which is not depicted. Thus, the bus controller 1e outputs an address to be accessed by the central processing unit (CPU) 1a, which is supplied to it via the high-speed bus 1d, to the external bus which is not depicted, and has a built-in buffer memory for storing data from the external bus.

The first functional module 1f is an IP core configured with hardware macros such as an interrupt controller (ICU), a data transfer controller (DTC), and a direct memory access controller (DMAC). Moreover, the first functional module 1f includes a data flash, a watchdog timer (WDT), a cyclical redundancy check module (CRC), a timer (TMR), and an A/D converter which are coupled to a low-speed internal peripheral bus which is in turn coupled to the internal high-speed bus id via the data transfer controller (DTC) and the direct memory access controller (DMAC). The interrupt controller (ICU) is responsible for processing of an interrupt from various peripheral modules internal and external to the semiconductor integrated circuit 1 to the central processing unit (CPU) 1a.

The second functional module 1g is a hardware macro characteristic of the semiconductor integrated circuit 1 according to the first embodiment. It is a drive pulse output generating circuit that generates drive pulse output signals φ1, φ2, φ3, φ4 which are applied to a plurality of electrostrictive elements of a stator for driving a rotor of the traveling wave type ultrasonic motor 2. The drive pulse output signals φ1, φ2, φ3, φ4 are 4-phase signals whose phases differ from each other in this example of the semiconductor integrated circuit 1 according to the first embodiment depicted in FIG. 1.

Configuration of the Drive Pulse Output Generating Circuit

FIG. 2 is a diagram depicting a configuration of the drive pulse output generating circuit which is the second functional module 1g in the semiconductor integrated circuit 1 according to the first embodiment depicted in FIG. 1.

Figure 14:
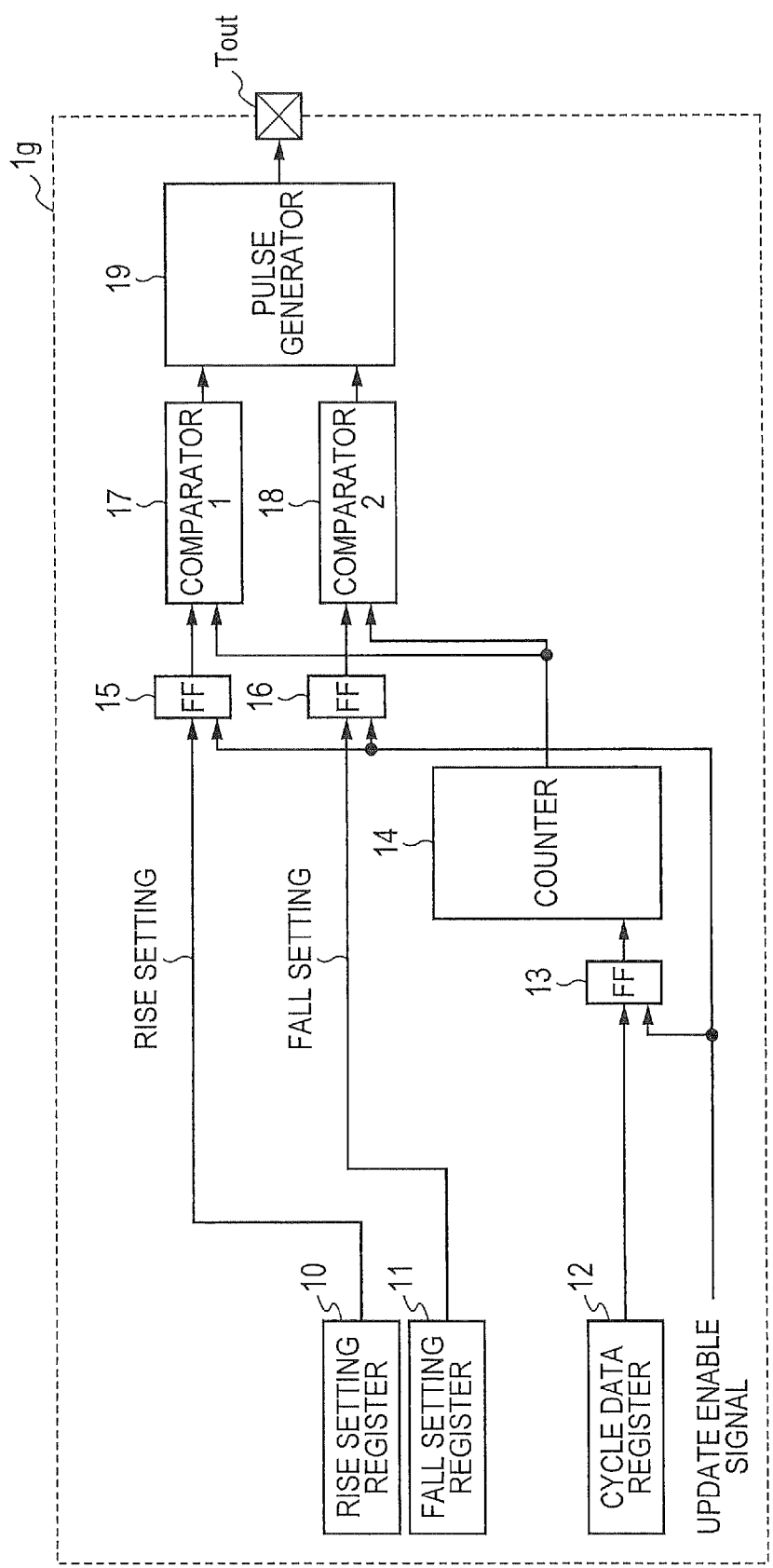
FIG. 14 is a diagram depicting a configuration of a drive pulse output generating circuit 1g examined by the present inventors et al. in advance of the present invention.
Figure 15:
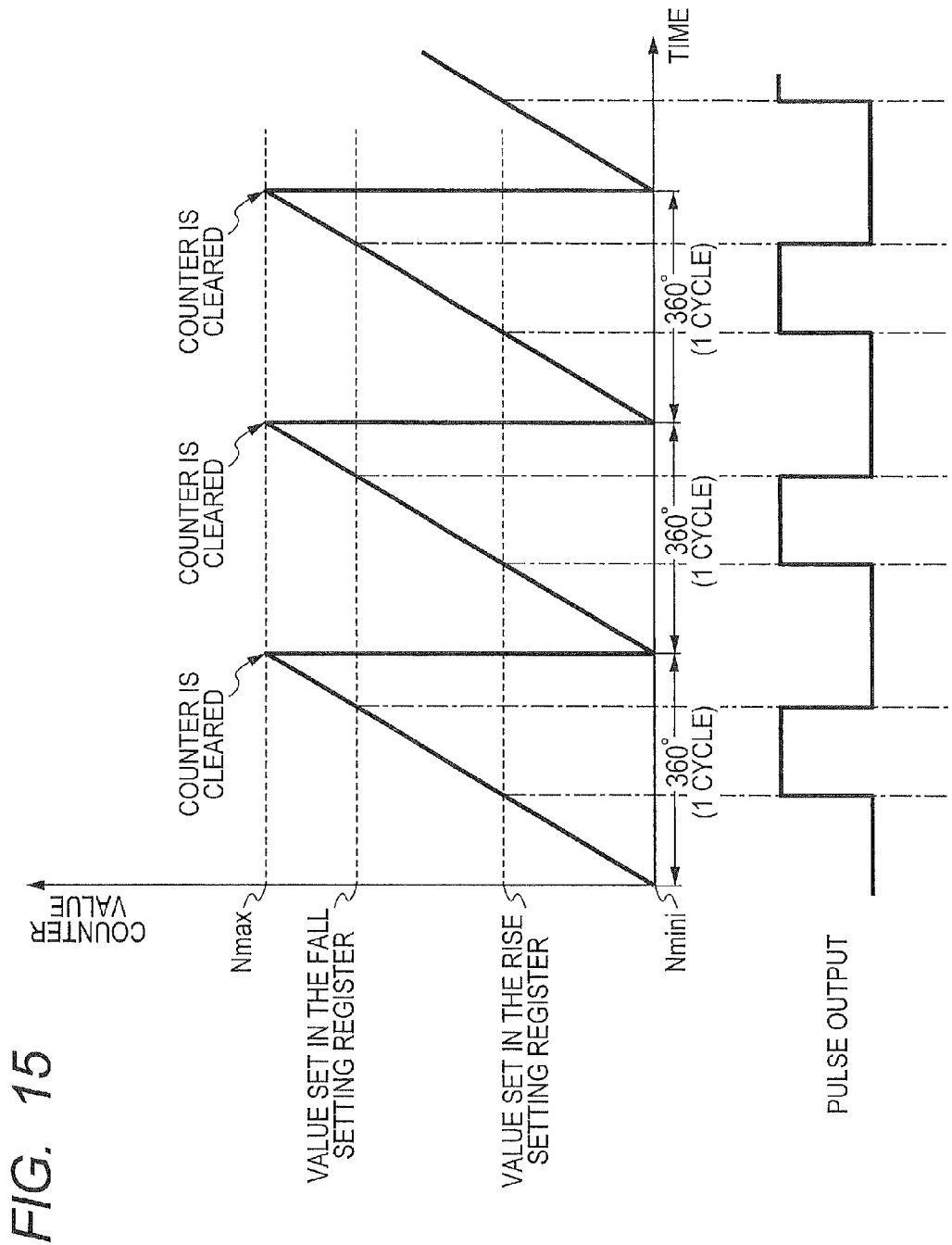
FIG. 15 is a diagram for explaining operation of the drive pulse output generating circuit 1g examined by the present inventors et al. in advance of the present invention, depicted in FIG. 14.

As depicted in FIG. 2, the drive pulse output generating circuit 1g is configured with a 1st register 10 for rise setting, a 2nd register for fall setting, a 3rd register 12 for setting cycle data, a 3rd flip-flop (FF) 13, and a counter 14, as is the case for the drive pulse output generating circuit 1g examined by the present inventors et al. in advance of the present invention, depicted in FIG. 14. The drive pulse output generating circuit 1g is further configured with a 1st flip-flop (FF) 15, a 2nd flip-flop (FF) 16, a 1st comparator 17, a 2nd comparator 18, and a pulse generator 19, as is the case for the drive pulse output generating circuit 1g examined by the present inventors et al. in advance of the present invention, depicted in FIG. 14.

Moreover, the drive pulse output generating circuit 1g includes a phase arithmetic circuit 1A, a 4th register 1E, a 4th flip-flop (FF) 1C, a 5th flip-flop (FF) 1D, a 1st selector 1E, and a 2nd selector 1F which are not included in the drive pulse output generating circuit 1g examined by the present inventors et al. in advance of the present invention, depicted in FIG. 14.

The counter 14 is configured to count up a 16-bit counter value in response to a clock signal which is not depicted. More specifically, a count initial value Nmini for the counter 14 to count up from it is set to, for example, 0 and a count maximum value Nmax for the counter 14 to count up to it can be set by cycle data that is set in the 3rd register 12.

Thus, the counter 14 starts to count up from the count initial value Nmini set to 0 and executes count up. When its counter value has reached the count maximum value Nmax set by cycle data held by the 3rd register 12, the counter value returns to the count initial value Nmini of 0 again and the counter executes count up in response to the clock signal.

Cycle data that is set in the 3rd register 12 is 16 bits, 16-bit data can be stored in the 3rd flip-flop (FF) 13, and the counter value of the counter 14 is also 16 bits. Thus, 16-bit data can be stored in the 1st flip-flop (FF) 15 and the 2nd flip-flop (FF) 16 respectively. The 1st comparator 17 and the 2nd comparator 18 detect a match or mismatch between two input signals of 16 bit data.

Either a rise setting counter value before pulse output timing adjustment and change, which was stored in the 1st register 10, or a rise setting counter value after pulse output timing adjustment and change, which was stored in the 4th flip-flop (FF) 1C, is selected by the 2nd selector 1F and stored into the 1st flip-flop (FF) 15 in response to an update enable signal.

Either a fall setting counter value before pulse output timing adjustment and change, which was stored in the 2nd register 11, or a fall setting counter value after pulse output timing adjustment and change, which was stored in the 5th flip-flop (FF) 1D, is selected by the 1st selector 1E and stored into the 2nd flip-flop (FF) 16 in response to an update enable signal.

Moreover, the count maximum value Nmax that is set by cycle data which was set in the 3rd register 12 is stored into the 3rd flip-flop (FF) 13 in response to an update enable signal.

While the counter 14 executes count up, starting from the count initial value Nmini of 0, it is detected by the 1st comparator 17 that a match occurs between a counter value output by the counter 14 and a rise setting value stored in the 1st flip-flop (FF) 15. Rise command information is generated from an output terminal of the 1st comparator 17. In response to the rise command information, the pulse generator 19 makes a drive pulse output signal at its output terminal Tout change from a low level to a high level.

While the counter 14 continues to count up, it is detected by the 2nd comparator 18 that a match occurs between a counter value output by the counter 14 and a fall setting value stored in the 2nd flip-flop (FF) 16. Fall command information is generated from an output terminal of the 2nd comparator 18. In response to the fall command information, the pulse generator 19 makes a drive pulse output signal at its output terminal Tout change from the high level to the low level.

While the counter 14 further continues to count up, when a counter value output by the counter 14 has reached the count maximum value Nmax which was set by cycle data held by the 3rd flip-flop (FF) 13, the counter value returns to the count initial value Nmini of 0 again and the counter executes count up in response to the clock signal.

A phase angle change value for timing adjustment of a pulse output signal is stored in the 4th register 1B which is a phase adjustment data register.

The phase angle change value for timing adjustment of a pulse output signal, stored in the 4th register 1B which is the phase adjustment data register, is supplied to a 1st input terminal In1 of the phase arithmetic circuit 1A. Cycle data, i.e., the count maximum value Nmax stored in the 3rd register 12 which is a cycle data register is supplied to a 2nd input terminal In2 of the phase arithmetic circuit 1A. A rise setting count value stored in the 1st register 10 as a rise setting register and a fall setting count value stored in the 2nd register 11 as a fall setting register are supplied to a 3rd input terminal In3 of the phase arithmetic circuit 1A.

It follows that the phase arithmetic circuit 1A executes arithmetic operations on the phase angle change value received at the 1st input terminal 1n1, cycle data, i.e., the count maximum value Nmax received at the 2nd input terminal 1n2, and the rise/fall setting count values received at the 3rd input terminal In3, thereby calculating a new rise setting counter value and a new fall setting counter value of the counter 14 required for timing adjustment of a pulse output signal. That is, the phase arithmetic circuit 1A outputs calculation results which are the same as those calculated by way of the procedure described with FIG. 16 from its output terminal OUT. A new rise setting counter value that is generated from the output terminal OUT of the phase arithmetic circuit 1A is stored into the 4th flip-flop (FF) 1C and a new fall setting counter value that is generated from the output terminal OUT of the phase arithmetic circuit 1A is stored into the 5th flip-flop (FF) 1D.

Hardware Configuration of the Phase Arithmetic Circuit

In the lower part of FIG. 2, there is depicted a hardware configuration of the phase arithmetic circuit 1A included in the drive pulse output generating circuit which is the second functional module 1g in the upper part of FIG. 2.

As depicted in the lower part of FIG. 2, the phase arithmetic circuit 1A includes a digital multiplying circuit 100, a digital dividing circuit 101, a digital adding circuit 102, a digital subtracting circuit 103, a multiplexer (MUX) 104, and a cycle overrun correction circuit 105 which are configured in hardware.

The digital multiplying circuit 100 performs multiplication of the phase angle change value received at the 1st input terminal 1n1 and cycle data, i.e., the count maximum value Nmax received at the 2nd input terminal 1n2. That is, the phase angle change value for timing adjustment of a pulse output signal, stored in the 4th register 1B which is the phase adjustment data register, is supplied to a 1st input terminal In1 of the digital multiplying circuit 100 and cycle data, i.e., the count maximum value Nmax stored in the 3rd register 12 which is the cycle data register is supplied to a 2nd input terminal Int of the digital multiplying circuit 100. As this digital multiplying circuit 100, a simplest multiplier may be used; other hardware such as a high-speed multiplier using a technique, e.g., carrier save adder, Wallance tree, or Booth's algorithm may be used.

A multiplication output signal from the digital multiplying circuit 100 is supplied to a 1st input terminal of the digital dividing circuit 101 and its 2nd input terminal is supplied with 360 degrees of phase angle for one cycle. As this digital dividing circuit 101, a simplest divider may be used; other hardware such as a high-speed divider using a technique, e.g., carrier save adder may be used.

A division output signal from the digital dividing circuit 101 is supplied to a 1st input terminal of the digital adding circuit 102 and a 1st input terminal of the digital subtracting circuit 103. And the rise setting counter value and the fall setting counter value stored in the 1st register 10 and the 2nd register 11 respectively are supplied to a 2nd input terminal of the digital adding circuit 102 and a 2nd input terminal of the digital subtracting circuit 103. Thus, an addition output signal yielded by adding the division output signal from the digital dividing circuit 101 and the rise setting counter value/fall setting counter value is generated from an addition output terminal of the digital adding circuit 102. And a subtraction output signal yielded by subtracting the division output signal from the digital dividing circuit 101 from the rise setting counter value/fall setting counter value is generated from a subtraction output terminal of the digital subtracting circuit 103. In a case when an overflow occurs, that is, an addition output signal being generated by the digital adding circuit 102 becomes larger than the count maximum value Nmax of the counter 14, the digital adding circuit 102 has a data correction function to avoid such an overflow, as will be detailed later. In a case when an underflow occurs, that is, a subtraction output signal being generated by the digital subtracting circuit 103 becomes smaller than the count initial value Nmini of the counter 14, the digital subtracting circuit 103 has a data correction function to avoid such an underflow, as will be detailed later.

A signal commanding a direction of adjustment is supplied to a selection control input terminal of the multiplexer (MUX) 104. 1st and 2nd input terminals of the multiplexer (MUX) 104 are supplied with an addition output signal from the digital adding circuit 102 and a subtraction output signal from the digital subtracting circuit 103, respectively. More specifically, when delaying the phase of a drive pulse output signal for driving the ultrasonic monitor by the phase angle change value stored in the phase adjustment data register (4th register) 1B, according to the signal commanding a direction of adjustment, the multiplexer (MUX) 104 outputs the addition output signal from the digital adding circuit 102, received at its 1st input terminal, to its output terminal. Inversely, when advancing the phase of a drive pulse output signal for driving the ultrasonic monitor by the phase angle change value stored in the phase adjustment data register (4th register) 1B, according to the signal commanding a direction of adjustment, the multiplexer (MUX) 104 outputs the subtraction output signal from the digital subtracting circuit 103, received at its 2nd input terminal, to its output terminal.

An output signal of the multiplexer (MUX) 104 is supplied to an input terminal of the cycle overrun correction circuit 105. This cycle overrun correction circuit 105 has a data correction function to avoid that a low-level or high-level pulse period of a drive pulse output signal being generated at the output terminal Tout of the pulse generator (19) in response to an arithmetic output signal from the output terminal OUT of the phase arithmetic circuit 1A exceeds one cycle of 360 degrees.

Procedure for Calculating a Rise Setting Value and a Fall Setting Value

FIG. 3 is a diagram explaining a procedure for calculating a rise setting value and a fall setting value as counter values of the counter 14 for adjustment of changing timing of a drive pulse output signal for an ultrasonic motor in the semiconductor integrated circuit 1 according to the first embodiment depicted in FIG. 2.

At a first step S400 in FIG. 3, multiplication of the count maximum value MAX as a counter value of the counter 14, which corresponds to cycle data that was set in the cycle data register (3rd register) 12, and a phase angle change value for timing adjustment, which was stored in the phase adjustment data register (4th register) 1B, is performed by the digital multiplying circuit 100. At this point, the count maximum value MAX of the counter 14 is represented by a binary number of 16 bits and the phase angle change value is represented by a decimal number. By the multiplication at this first step S400, a first calculated value is calculated.

At a next step S500 presented in FIG. 3, the digital dividing circuit 101 divides the first calculated value calculated at the first step S400 by 360 degrees of phase angle for one cycle. By the division at step S500, a changed counter value of the counter 14 required for desired phase angle change is calculated. This counter value of the counter 14 is also represented by a binary number of 16 bits.

At a further step S600 presented in FIG. 3, when delaying the phase by the phase angle change value, the digital adding circuit 102 performs addition of the changed counter value of the counter 14 required for desired phase angle change, calculated at step S500, and a counter setting value of the counter 14 for rise setting, which is now set in the 1st register 10 before phase angle change. Moreover, at this step S600, the adding circuit 102 performs addition of the changed counter value of the counter 14 required for desired phase angle change, calculated at step S500, and a counter setting value of the counter 14 for fall setting, which is now set in the 2nd register 11 before phase angle change. Thus, by the addition at step S600, for the counter 14, a new rise setting counter value and a new fall setting counter value required for desired changing timing adjustment of a drive pulse output signal are calculated.

At the further step S600 presented in FIG. 3, when advancing the phase by the phase angle change value, the digital subtracting circuit 103 performs subtraction that subtracts the changed counter value of the counter 14 required for desired phase angle change, calculated at step S500, from the counter setting value of the counter 14 for rise setting, which is now set in the 1st register 10 before phase angle change. Moreover, at this step S600, the subtracting circuit 103 performs subtraction that subtracts the changed counter value of the counter 14 required for desired phase angle change, calculated at step S500, from the counter setting value of the counter 14 for fall setting, which is now set in the 2nd register 11 before phase angle change. Thus, by the subtraction at step S600, for the counter 14, a new rise setting counter value and a new fall setting counter value required for desired changing timing adjustment of a drive pulse output signal are calculated.

Figure 16:
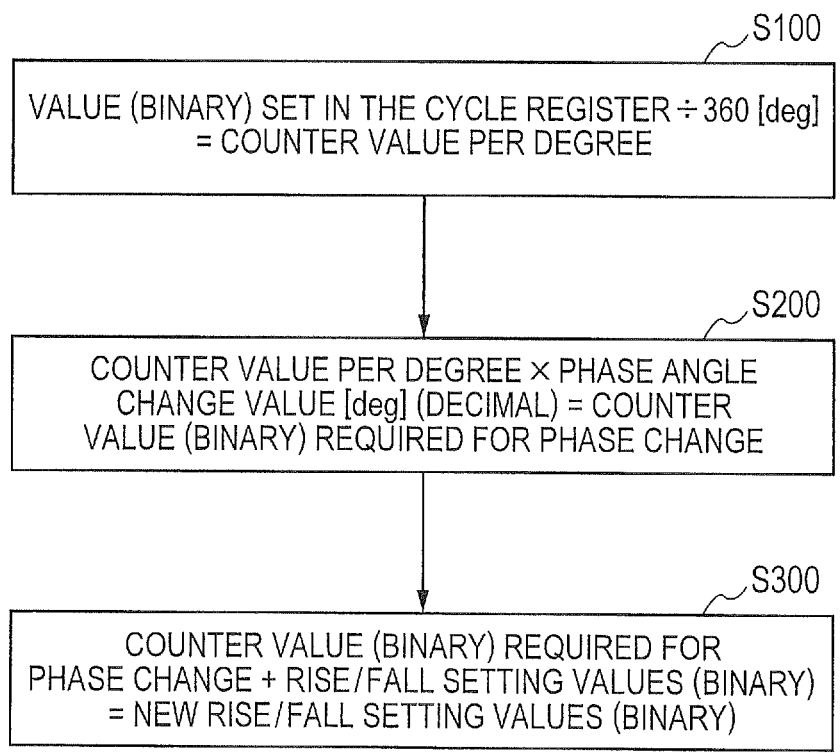
FIG. 16 is a diagram explaining a procedure for calculating a rise setting value and a fall setting value as counter values of a counter 14 for adjustment of changing timing of a drive pulse output signal for an ultrasonic motor in the drive pulse output generating circuit 1g examined by the present inventors et al. in advance of the present invention, depicted in FIG. 14.

In the procedure illustrated in FIG. 3 for calculating a rise setting value and a fall setting value for the semiconductor integrated circuit 1 of the first embodiment, when compared with the procedure illustrated in FIG. 16 for calculating a rise setting value and a fall setting value for the semiconductor integrated circuit 1 examined by the present inventors et al. in advance of the present invention, multiplication is performed in the first step S400 and division is performed in the next step S500.

In the procedure illustrated in FIG. 16 for calculating a rise setting value and a fall setting value, examined by the present inventors et al. in advance of the present invention, division is performed in the first step S100 and multiplication is performed in the next step S200. As a result, there is a problem in which arithmetic accuracy decreases, as integer division ignores digits after the decimal point. To resolve this problem, it is needed to perform floating-point division entailing a larger amount of arithmetic operation. On the other hand, in the procedure illustrated in FIG. 3 for calculating a rise setting value and a fall setting value for the semiconductor integrated circuit 1 of the first embodiment, the foregoing problem can be resolved only by simply reversing the order in which to perform division and multiplication.

Bit Configuration of the Phase Adjustment Data Register

Figure 4:
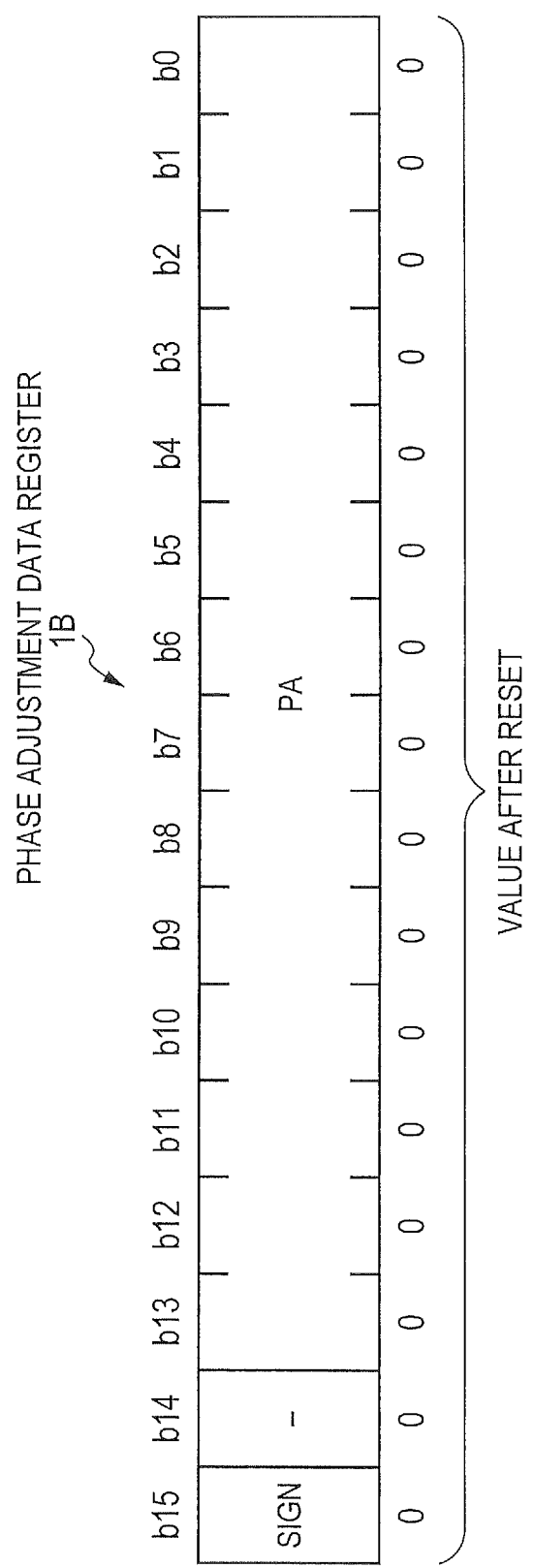
FIG. 4 is a diagram depicting a bit configuration of a phase adjustment data register (4th register) 1B of the phase arithmetic circuit 1A in the semiconductor integrated circuit 1 of the first embodiment depicted in FIG. 2.

FIG. 4 is a diagram depicting a bit configuration of the phase adjustment data register (4th register) 1B of the phase arithmetic circuit 1A in the semiconductor integrated circuit 1 of the first embodiment depicted in FIG. 2.

As depicted in FIG. 4, 1st through 14th bits, b0 through b13, are phase adjustment data bits PA representing a phase angle change value for timing adjustment. A 15th bit b14 is a reserved bit for future use for any purpose and a 16th bit b15 is an adjustment value sign bit. In particular, the 16th bit b15, namely, the adjustment value sign bit is set to "1", when advancing the phase by a phase angle change value is performed and set to "0", when delaying the phase by a phase angle change value is performed.

Register Setting of the Phase Adjustment Data Register

FIG. 5 is a diagram explaining register setting values corresponding to phase angle change values settable in the phase adjustment data register (4th register) 1B of the phase arithmetic circuit 1A in the semiconductor integrated circuit 1 of the first embodiment depicted in FIG. 2.

A leftmost column lists angle change values; a second column from the left lists the phase angle change values multiplied by 100; a third column from the left lists a value of the adjustment value sign bit, namely, the 16th bit b15; and a rightmost column lists register setting values that are set in the phase adjustment data register, corresponding to the phase angle change values. Reasons why the phase angle change values are multiplied by 100 in the second column from the left are because phase angle change values should be specified accurately to two decimal places and because the digital multiplying circuit 100 in the phase arithmetic circuit 1A should be configured as an integer multiplier not a floating-point multiplier.

A first example is a phase angle change value of +90.00°. This value is multiplied by 100, which gives +9000. The adjustment bit sign bit is set to "0". A register setting value of 2328 h represented in hexadecimal is set in the phase adjustment data register 1B. In order to convert a decimal number to a hexadecimal number, the decimal number is divided by 16, a resulting quotient is further divided by 16, which is repeated until a quotient of 0 results, while keeping all remainders, and the remainders are put in order beginning with the last remainder up to the first one. Hence, a decimal number of +9000 is converted to a hexadecimal number as follows.

+9000÷16=562 giving a remainder of 8
562÷16=35 giving a remainder of 2
35÷16=2 giving a remainder of 3
2÷16=0 giving a remainder of 2

By putting four remainders thus given put in order from bottom up, a hexadecimal number of 2328 h is obtained. A suffix h denotes a hexadecimal number. Converting a decimal number to a hexadecimal number can be performed by activating software "calculators" included in accessory of an operating system OS of a personal computer (PC) and selecting a mathematical calculator from a "calculator type" menu.

In FIG. 5, a negative phase angle change value like −90.00° which is listed last (that is, a phase angle change value for advancing the phase) is calculated from a positive phase angle change value (that is, a phase angle change value for delaying the phase). More specifically, the hexadecimal number of 2328 h of the positive phase angle change value of +90.00° is represented in binary notation as follows.

0010 0011 0010 1000

To calculate a register setting value for the negative phase angle change value of −90.00°, the most significant bit of this value of binary notation is changed from "0" to "1". This change of the most significant bit corresponds to "1" (advancing the phase) and "0" (delaying the phase) of the adjustment value sign bit, namely, the 16th bit b15 of the phase adjustment data register 1B depicted in FIG. 4.

By this change of the most significant bit, the following value of binary notation is obtained.

1010 0011 0010 1000

This value of binary notation is represented in hexadecimal as A328h. In this way, a register setting value that is set in the phase adjustment data register 1B, corresponding to the negative phase angle change value of −90.00° is obtained.

Register setting values that may be set in the phase adjustment data register 1B corresponding to other positive and negative phase angle change values presented in FIG. 5 are calculated in exactly the same way of calculation as described above.

Accordingly, in the semiconductor integrated circuit 1 of the first embodiment depicted in FIG. 2, a hexadecimal register setting value as presented in the rightmost column of FIG. 5 is stored in the phase adjustment data register (4th register) 1B of the phase arithmetic circuit 1A for timing adjustment of a pulse output signal for driving the traveling wave type ultrasonic motor 2. That is, in the semiconductor integrated circuit 1 of the first embodiment depicted in FIG. 1, the central processing unit (CPU) 1a stores a hexadecimal register setting value into the phase adjustment data register 1B by executing control software for the traveling wave type ultrasonic motor 2 stored in the read only memory (ROM) 1b.

Figure 6:
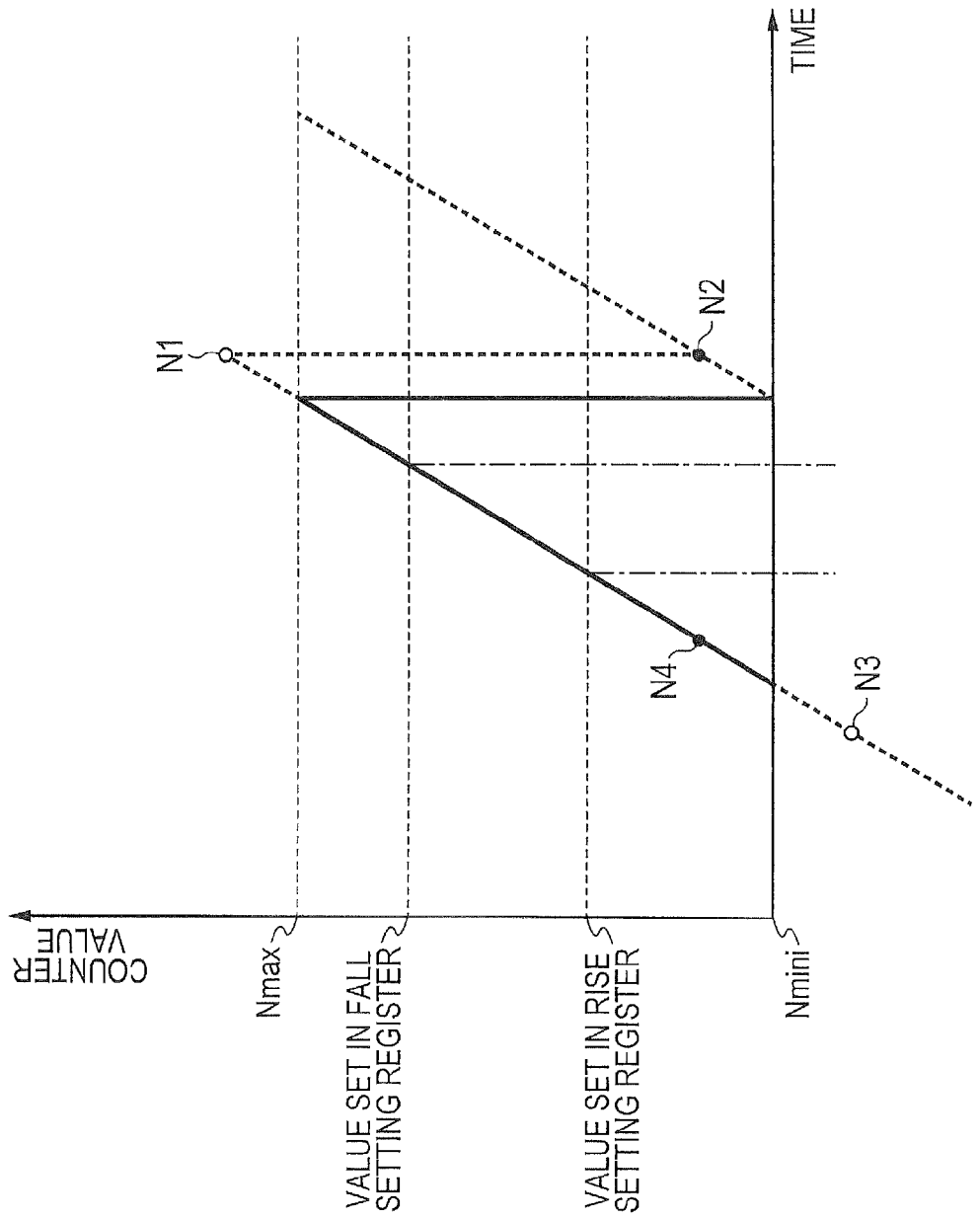
FIG. 6 is a diagram explaining a data correction function of a digital adding circuit 102 and of a digital subtracting circuit 103 in the phase arithmetic circuit 1A according to the first embodiment depicted in FIG. 2.

Data Correction Function of the Digital Adding Circuit and of the Digital Subtracting Circuit FIG. 6 is a diagram explaining the data correction function of the digital adding circuit 102 and of the digital subtracting circuit 103 in the phase arithmetic circuit 1A according to the first embodiment depicted in FIG. 2.

In some cases, by the previously described procedure of FIG. 3 for calculating a rise setting value and a fall setting value for the semiconductor integrated circuit 1 of the first embodiment, an overflow may occur, that is, an addition output signal being generated by the digital adding circuit 102 becomes larger than the count maximum value Nmax of the counter 14. In FIG. 6, a count value N1 becomes larger than the count maximum value Nmax of the counter 14, which means an overflow occurring. In such a case, the digital adding circuit 102 in the phase arithmetic circuit 1A according to the first embodiment depicted in FIG. 2 exerts the data correction function to avoid this overflow. That is, the digital adding circuit 102 generates a corrected count value N2 by subtracting the count maximum value Nmax from the overflow count value N1. Then, the phase arithmetic circuit 1A stores this corrected count value N2 into the 4th flip-flop (FF) 1C.

Also, in some cases, by the procedure of FIG. 3 for calculating a rise setting value and a fall setting value for the semiconductor integrated circuit 1 of the first embodiment, an underflow may occur, that is, a subtraction output signal being generated by the digital subtracting circuit 103 becomes smaller than the count initial value Nmini of the counter 14. In FIG. 6, a count value N3 becomes smaller than the count initial value Nmini of the counter 14, which means an underflow occurring. In such a case, the digital subtracting circuit 103 in the phase arithmetic circuit 1A according to the first embodiment depicted in FIG. 2 generates a corrected count value N4 as an absolute value of the negative value of the underflow count value N3. Then, the phase arithmetic circuit 1A stores this corrected count value N4 into the 5th flip-flop (FF) 1D.

Advantageous Effects of the Semiconductor Integrated Circuit of the First Embodiment According to the semiconductor integrated circuit 1 according to the first embodiment described hereinbefore with reference to FIGS. 1 through 6, arithmetic processing for timing adjustment of a pulse output signal is performed by the phase arithmetic circuit 1A configured with hardware macros. Therefore, it is possible to reduce the amount of computation to be performed by the central processing unit (CPU) or the required amount of storage space in the built-in memory for such timing adjustment.

Moreover, according to the semiconductor integrated circuit 1 according to the first embodiment described with reference to FIGS. 1 through 6, because the digital multiplying circuit 100 precedes the digital dividing circuit 101 in the phase arithmetic circuit 1A, multiplication is performed before division. Consequently, it is possible to resolve a problem in which arithmetic accuracy decreases, as integer division ignores digits after the decimal point. Or it is possible to resolve a problem in which it is needed to perform floating-point division entailing a larger amount of arithmetic operation.

Furthermore, according to the semiconductor integrated circuit 1 according to the first embodiment described with reference to FIGS. 1 through 6, phase angle change values are multiplied by 100, as presented in the second column from the left in FIG. 5 which explains register setting values corresponding to phase angle change values settable in the phase adjustment data register 1E. Therefore, it is possible that phase angle change values are specified accurately to two decimal places and that the digital multiplying circuit 100 in the phase arithmetic circuit 1A is configured as an integer multiplier not a floating-point multiplier.

Second Embodiment

Another Configuration of a Drive Pulse Output Generating Circuit

FIG. 7 is a diagram depicting another configuration of a drive pulse output generating circuit which is a second functional module 1g of a semiconductor integrated circuit 1 according to a second embodiment.

The drive pulse output generating circuit 1g according to the second embodiment depicted in FIG. 7 differs from the drive pulse output generating circuit 1g according to the first embodiment depicted in FIG. 2 in the following point.

To the drive pulse output generating circuit 1g according to the second embodiment depicted in FIG. 7, an update enable register 1G, an update timing control register 1H, an AND circuit 1I, and an update timing control circuit 1J are added which are not included in the drive pulse output generating circuit 1g according to the first embodiment depicted in FIG. 2.

In the drive pulse output generating circuit 1g according to the second embodiment depicted in FIG. 7, an update enable signal from an output terminal of the update enable register 1G and a timing signal from an output terminal of the update timing control circuit 1J are supplied to 1st and 2nd input terminals of the AND circuit 1I respectively. When a high-level enable signal is supplied from the update timing control register 1H to a control input terminal of the update timing control circuit 1J, the update timing control circuit 1J is activated. Conversely, when a low-level disable signal is supplied from the update timing control register 1H to the control input terminal of the update timing control circuit 1J, the update timing control circuit 1J is deactivated.

An output signal of a 1st comparator 17 and an output signal of a 2nd comparator 18 are supplied to 1st and 2nd input terminals of the update timing control circuit 1J. An output signal of a 1st flip-flop (FF) 15, an output signal of a 2nd flip-flop (FF) 16, and an output signal of a 3rd flip-flop (FF) 13 are supplied to 3rd, 4th, and 5th input terminals of the update timing control circuit 1J.

Moreover, in the drive pulse output generating circuit 1g according to the second embodiment depicted in FIG. 7, the 1st flip-flop (FF) 15, the 2nd flip-flop (FF) 16, and the 3rd flip-flop (FF) 13 stores their respective updated counter values in response to a high-level update command signal from an output terminal of the AND circuit 1I.

Also in the drive pulse output generating circuit 1g according to the second embodiment depicted in FIG. 7, a phase arithmetic circuit 1A is configured with a digital multiplying circuit 100, a digital dividing circuit 101, a digital adding circuit 102, a digital subtracting circuit 103, a multiplexer (MUX) 104, and a cycle overrun correction circuit 105 which are configured in hardware in exactly the same arrangement as depicted in the lower part of FIG. 2.

Operation of the Drive Pulse Output Generating Circuit

Figure 8A:
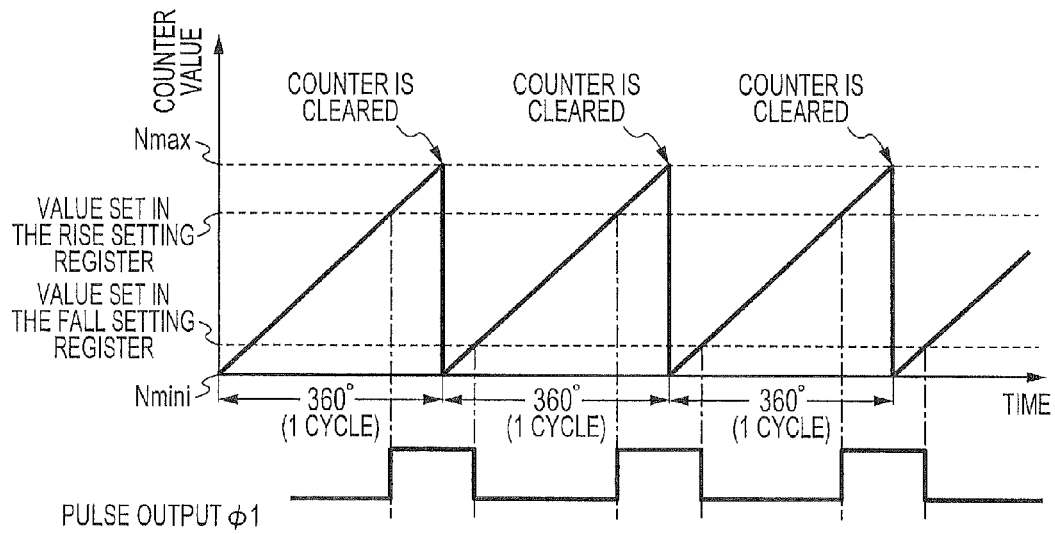
FIGS. 8A and 8B are diagrams explaining operation that would take place, when the drive pulse output generating circuit 1g according to the second embodiment depicted in FIG. 7 does not have an update enable register 1G, an update timing control register 1H, an AND circuit 1I, and an update timing control circuit 1J.
Figure 8B:
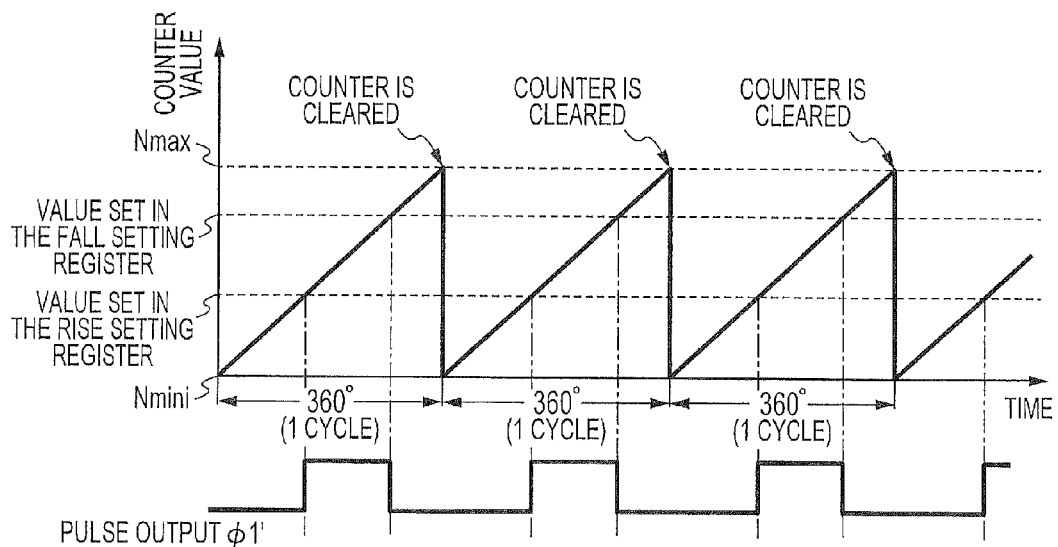

FIGS. 8A and 8B are diagrams explaining operation that would take place, when the drive pulse output generating circuit 1g according to the second embodiment depicted in FIG. 7 does not have the update enable register 1G, the update timing control register 1H, the AND circuit 1I, and the update timing control circuit 1J.

FIG. 8A is a diagram explaining operation of the drive pulse output generating circuit 1g according to the second embodiment depicted in FIG. 7 without the above-mentioned circuits before an operation of phase angle change with the phase adjustment data register (4th register) 1B.

As presented in FIG. 8A, a rise setting value stored in the 1st flip-flop (FF) 15 is close to the count maximum value Nmax for the counter 14 to count up to it, which is set in the cycle data register 12. A fall setting value stored in the 2nd flip-flop (FF) 16 is close to the count initial value Nmini for the counter 14 to count up from it.

In response to a match occurring between the counter value of the counter 14 and the rise setting value stored in the 1st flip-flop (FF) 15, a drive pulse output signal ϕ1 generated by the pulse generator 19 changes from the low level to the high level.

Besides, in response to a match occurring between the counter value of the counter 14 and the fall setting value stored in the 2nd flip-flop (FF) 16, the drive pulse output signal ϕ1 generated by the pulse generator 19 changes from the high level to the low level.

Hence, as presented in FIG. 8A, a high-level period of the drive pulse output signal ϕ1 generated by the pulse generator 19 crosses a cycle boundary between two cycles.

FIG. 8B is a diagram explaining operation of the drive pulse output generating circuit 1g according to the second embodiment depicted in FIG. 7 without the above-mentioned circuits after an operation of phase angle change with the phase adjustment data register (4th register) 1B. As presented in FIG. 8B, a low-level period of a drive pulse output signal ϕ1' generated by the pulse generator 19 crosses a cycle boundary between two cycles.

As presented in FIG. 8B, a rise setting value stored in the 1st flip-flop (FF) 15 is close to the count maximum value Nmax for the counter 14 to count up to it, which is set in the cycle data register 12. A fall setting value stored in the 2nd flip-flop (FF) 16 is close to the count initial value Nmini for the counter 14 to count up from it.

In response to a match occurring between the counter value of the counter 14 and the rise setting value stored in the 1st flip-flop (FF) 15, the drive pulse output signal ϕ1' generated by the pulse generator 19 changes from the low level to the high level.

Beside, in response to a match occurring between the counter value of the counter 14 and the fall setting value stored in the 2nd flip-flop (FF) 16, the drive pulse output signal ϕ1' generated by the pulse generator 19 changes from the high level to the low level.

Hence, as presented in FIG. 8B, a high-level period of drive pulse output signal ϕ1' generated by the pulse generator 19 lies within the period of one cycle.

Figure 9A:
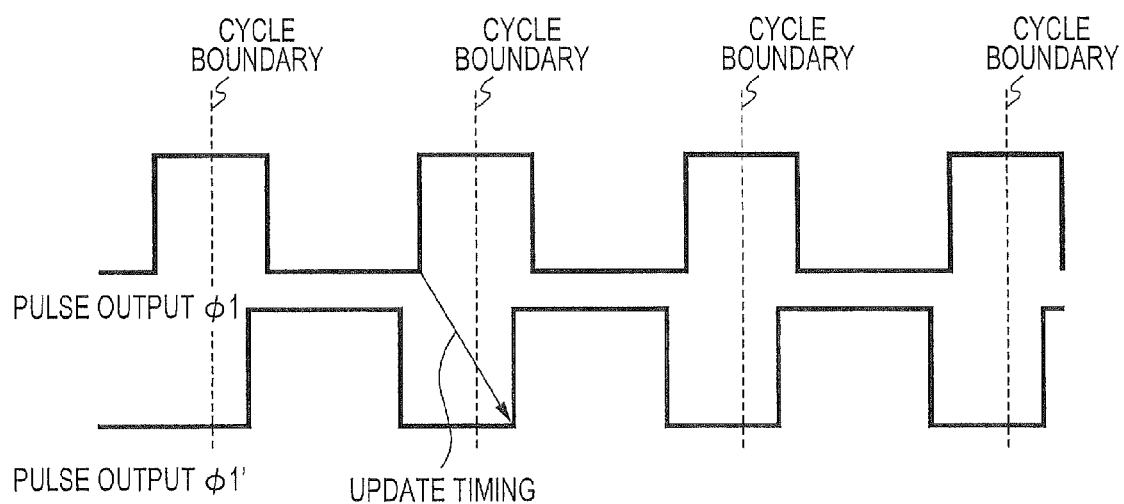
FIGS. 9A and 9B are diagrams explaining operation that would take place, when the drive pulse output generating circuit 1g according to the second embodiment depicted in FIG. 7 does not have the update enable register 1G, the update timing control register 1H, the AND circuit 1I, and the update timing control circuit 1J.
Figure 9B:
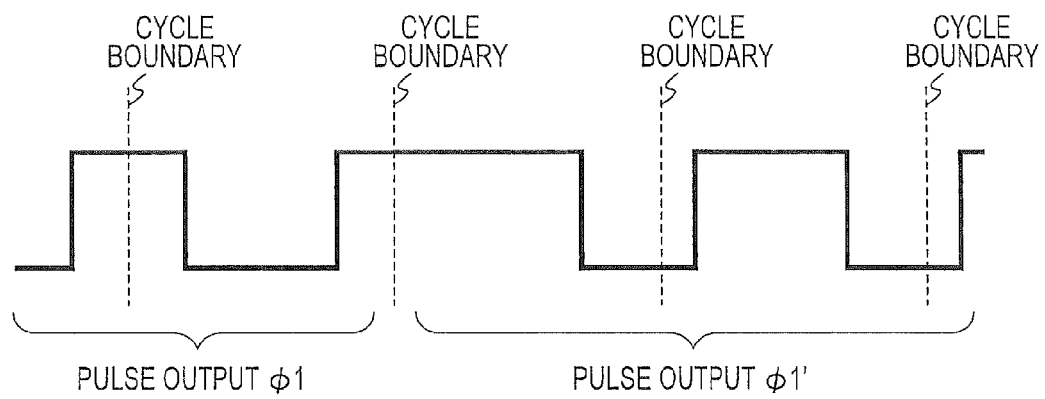

FIGS. 9A and 9B are diagrams explaining operation that would take place, when the drive pulse output generating circuit 1g according to the second embodiment depicted in FIG. 7 does not have the update enable register 1G, the update timing control register 1H, the AND circuit 1I, and the update timing control circuit 1J.

FIG. 9A presents the drive pulse output signal ϕ1 generated by the pulse generator 19 before an operation of phase angle change, presented in FIG. 8A, and the drive pulse output signal ϕ1' generated by the pulse generator 19 after an operation of phase angle change, presented in FIG. 8B. As presented in FIG. 9A, across a second cycle boundary, the rise setting value in the 1st flip-flop (FF) 15 and the fall setting value in the 2nd flip-flop (FF) 16 are updated to a changed rise setting counter value stored in the 4th flip-flop (FF) 1C and a changed fall setting counter value stored in the 5th flip-flop (FF) 1D, respectively.

FIG. 9B is a diagram presenting behavior of the signal being generated by the pulse generator 19 switching from the drive pulse output signal ϕ1 to the drive pulse output signal ϕ1' due to the fact that the rise setting value in the 1st flip-flop (FF) 15 and the fall setting value in the 2nd flip-flop (FF) 16 are updated around the timing of the second cycle boundary, as presented in FIG. 9A.

However, as presented in FIG. 9B, a problem arises in which the drive pulse output signal being generated by the pulse generator 19 has an abnormally long high-level period around the timing of the second cycle boundary. As a result, a problem in which normally driving the ultrasonic motor 2 to run is not achievable and, in the worst case, the ultrasonic motor 2 might come down by overcurrent was also found out by the examination made by the present inventors et al. in advance of the present invention.

In contrast, the update timing control circuit 1J included in the drive pulse output generating circuit 1g according to the second embodiment of FIG. 7 is supplied with a comparison result from the 1st comparator 17, a comparison result from the 2nd comparator 18, a rise setting value in the 1st flip-flop (FF) 15, a fall setting value in the 2nd flip-flop (FF) 16, and cycle data in the 3rd flip-flop (FF) 13. Accordingly, the update timing control circuit 1J supplies a mask signal to the AND circuit 1I. The mask signal prevents switching from the drive pulse output signal ϕ1 to the drive pulse output signal ϕ1' at such timing that causes the drive pulse output signal being generated by the pulse generator 19 to have an abnormally long high-level period.

More specifically, the update timing control circuit 1J predicts occurrence of an abnormal operation from various parameters of the drive pulse output generating circuit 1g with the phase arithmetic circuit 1A according to the second embodiment depicted in FIG. 7 and delays the switching timing of the drive pulse output signal by one cycle.

Figure 10A:
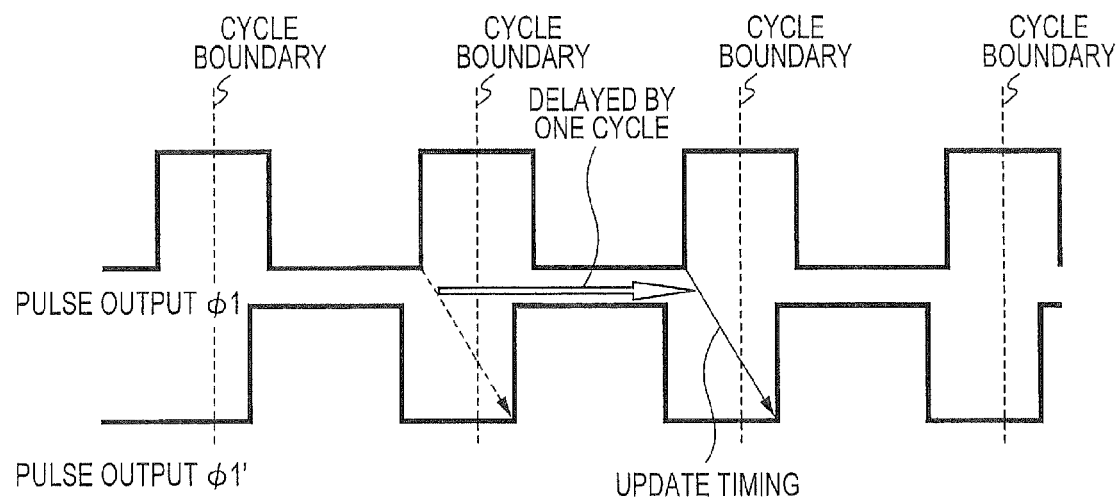
FIGS. 10A and 10B are diagrams explaining normal operation behavior that is accomplished owing to the fact that the drive pulse output generating circuit 1g according to the second embodiment depicted in FIG. 7 has the update enable register 1G, the update timing control register 1H, the AND circuit 1I, and the update timing control circuit 1J.
Figure 10B:
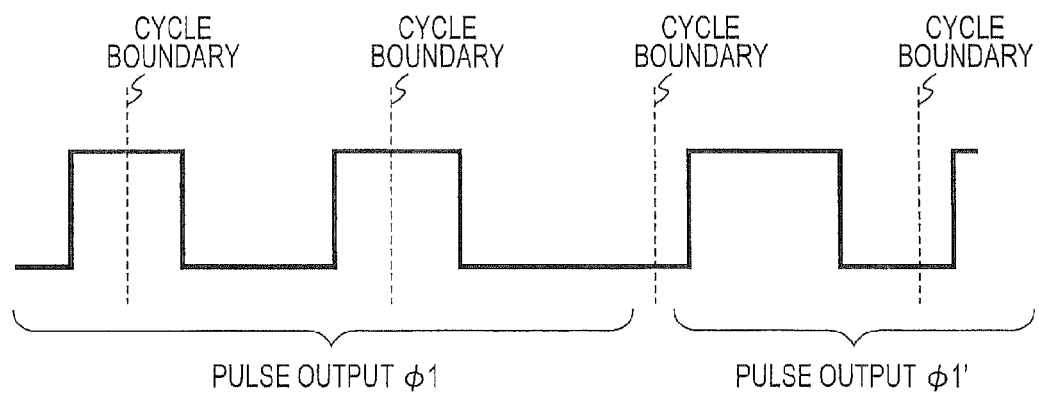

FIGS. 10A and 10B are diagrams explaining normal operation behavior that is accomplished owing to the fact that the drive pulse output generating circuit 1g according to the second embodiment depicted in FIG. 7 has the update enable register 1G, the update timing control register 1H, the AND circuit 1I, and the update timing control circuit 1J.

Similarly to FIG. 9A, FIG. 10A presents the drive pulse output signal φ1 generated by the pulse generator 19 before an operation of phase angle change, presented in FIG. 8A, and the drive pulse output signal φ1' generated by the pulse generator 19 after an operation of phase angle change, presented in FIG. 8B. However, as presented in FIG. 10A, update is performed across a third cycle boundary delayed by one cycle from the second cycle boundary. That is, in the update timing of the third cycle boundary, the rise setting value in the 1st flip-flop (FF) 15 and the fall setting value in the 2nd flip-flop (FF) 16 are updated to a changed rise setting counter value stored in the 4th flip-flop (FF) 1C and a changed fall setting counter value stored in the 5th flip-flop (FF) 1D, respectively.

FIG. 10B is a diagram presenting behavior of the signal being generated by the pulse generator 19 switching from the drive pulse output signal φ1 to the drive pulse output signal φ1' due to the fact that the rise setting value in the 1st flip-flop (FF) 15 and the fall setting value in the 2nd flip-flop (FF) 16 are updated around the timing of the third cycle boundary, as presented in FIG. 10A.

Figure 11A:
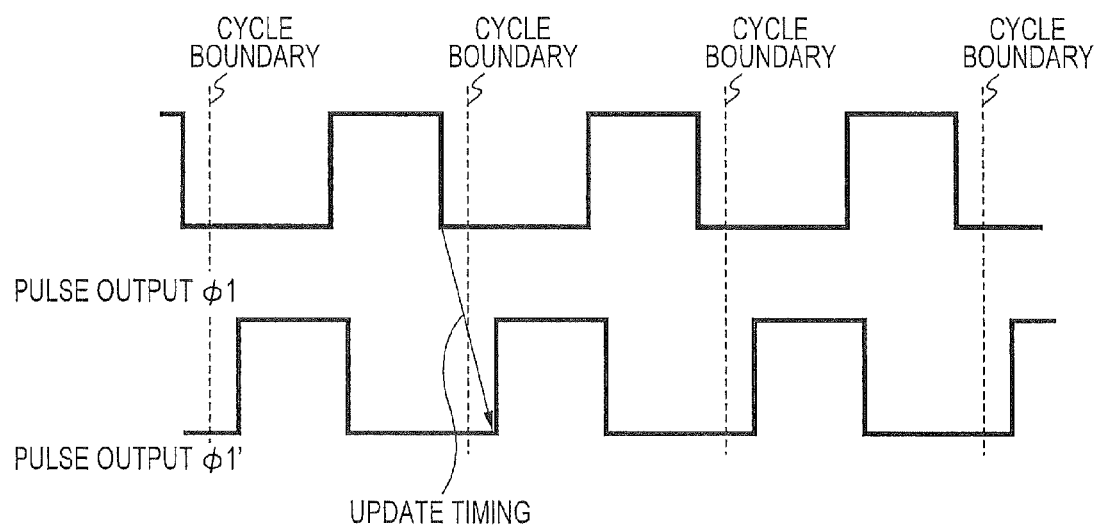
FIGS. 11A and 11B are diagrams explaining operation that would take place, when the drive pulse output generating circuit 1g according to the second embodiment depicted in FIG. 7 does not have the update enable register 1G, the update timing control register 1H, the AND circuit 1I, and the update timing control circuit 1J.
Figure 11B:
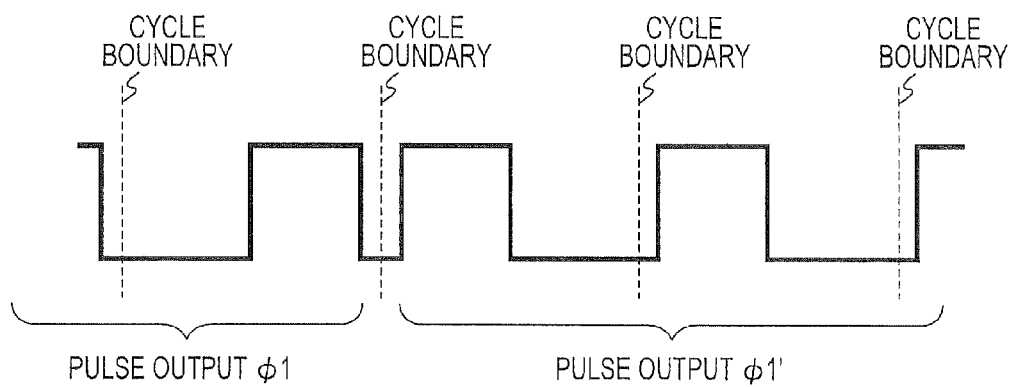

FIGS. 11A and 11B are diagrams explaining operation that would take place, when the drive pulse output generating circuit 1g according to the second embodiment depicted in FIG. 7 does not have the update enable register 1G, the update timing control register 1H, the AND circuit 1I, and the update timing control circuit 1J.

FIG. 11A presents the drive pulse output signal φ1 generated by the pulse generator 19 before an operation of phase angle change and the drive pulse output signal φ1' generated by the pulse generator 19 after an operation of phase angle change. As presented in FIG. 11A, the low-level periods of the drive pulse output signal φ1 and the drive pulse output signal φ1' generated by the pulse generator 19 cross a cycle boundary between two cycles.

Moreover, as presented in FIG. 11A, across a second cycle boundary, the rise setting value in the 1st flip-flop (FF) 15 and the fall setting value in the 2nd flip-flop (FF) 16 are updated to a changed rise setting counter value stored in the 4th flip-flop (FF) 1C and a changed fall setting counter value stored in the 5th flip-flop (FF) 1D, respectively.

FIG. 11B is a diagram presenting behavior of the signal being generated by the pulse generator 19 switching from the drive pulse output signal φ1 to the drive pulse output signal φ1' due to the fact that the rise setting value in the 1st flip-flop (FF) 15 and the fall setting value in the 2nd flip-flop (FF) 16 are updated around the timing of the second cycle boundary, as presented in FIG. 11A.

However, as presented in FIG. 11B, a problem arises in which, around the timing of the second cycle boundary, an abnormally short low-level period occurs between two high-level periods of the drive pulse output signal being generated by the pulse generator 19. As a result, a problem in which normally driving the ultrasonic motor 2 to run is not achievable and, in the worst case, the ultrasonic motor 2 might come down by overcurrent was also found out by the examination made by the present inventors et al. in advance of the present invention.

In contrast, the update timing control circuit 1J included in the drive pulse output generating circuit 1g according to the second embodiment of FIG. 7 is supplied with a comparison result from the 1st comparator 17, a comparison result from the 2nd comparator 18, a rise setting value in the 1st flip-flop (FF) 15, a fall setting value in the 2nd flip-flop (FF) 16, and cycle data in the 3rd flip-flop (FF) 13. Accordingly, the update timing control circuit 1J supplies a mask signal to the AND circuit 1I. The mask signal prevents switching from the drive pulse output signal φ1 to the drive pulse output signal φ1' at such timing that causes the drive pulse output signal being generated by the pulse generator 19 to have an abnormally short low-level period.

More specifically, the update timing control circuit 1J predicts occurrence of an abnormal operation from various parameters of the drive pulse output generating circuit 1g with the phase arithmetic circuit 1A according to the second embodiment depicted in FIG. 7 and delays the switching timing of the drive pulse output signal by one cycle.

Figure 12A:
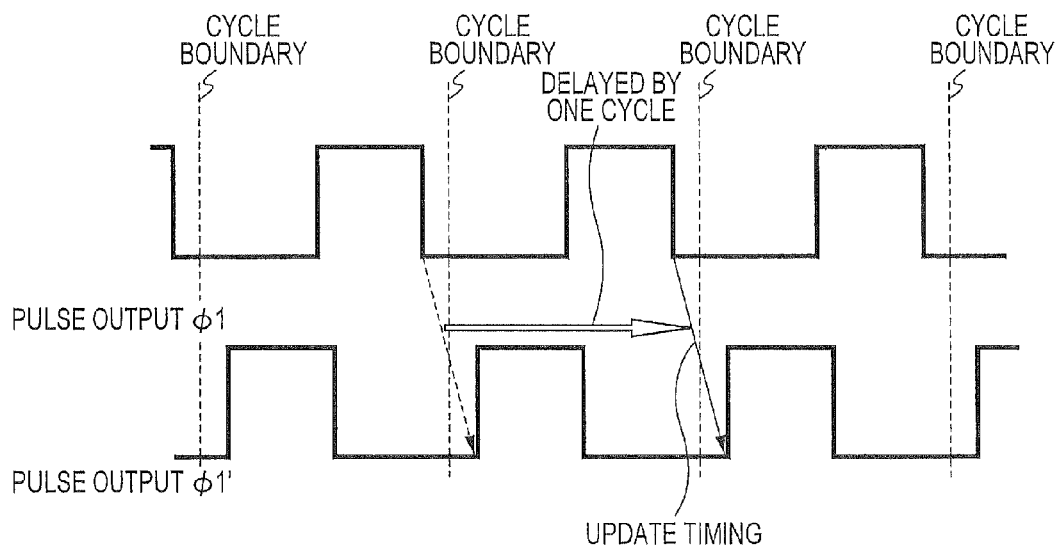
FIGS. 12A and 12B are diagrams explaining normal operation behavior that is accomplished owing to the fact that the drive pulse output generating circuit 1g according to the second embodiment depicted in FIG. 7 has the update enable register 1G, the update timing control register 1H, the AND circuit 1I, and the update timing control circuit 1J.
Figure 12B:
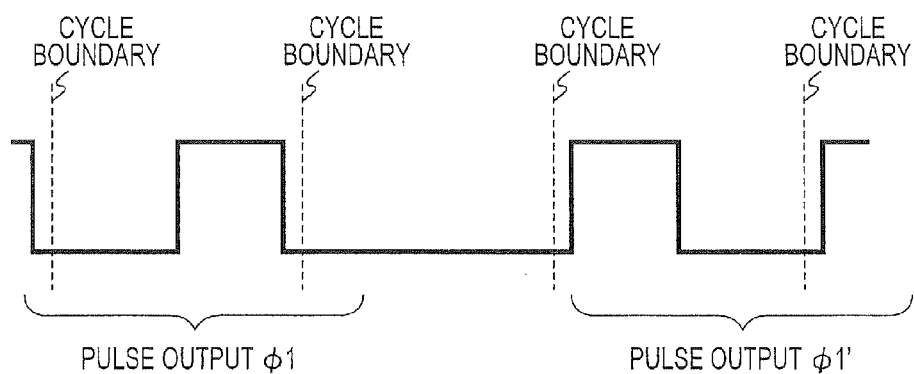

FIGS. 12A and 12B are diagrams explaining normal operation behavior that is accomplished owing to the fact that the drive pulse output generating circuit 1g according to the second embodiment depicted in FIG. 7 has the update enable register 1G, the update timing control register 1H, the AND circuit 1I, and the update timing control circuit 1J.

Similarly to FIG. 11A, FIG. 12A presents the drive pulse output signal φ1 generated by the pulse generator 19 before an operation of phase angle change, presented in FIG. 8A, and the drive pulse output signal φ1' generated by the pulse generator 19 after an operation of phase angle change, presented in FIG. 8B. However, as presented in FIG. 12A, update is performed across a third cycle boundary delayed by one cycle from the second cycle boundary. That is, in the update timing of the third cycle boundary, the rise setting value in the 1st flip-flop (FF) 15 and the fall setting value in the 2nd flip-flop (FF) 16 are updated to a changed rise setting counter value stored in the 4th flip-flop (FF) 1C and a changed fall setting counter value stored in the 5th flip-flop (FF) 1D, respectively.

FIG. 12B presents behavior of the signal being generated by the pulse generator 19 switching from the drive pulse output signal φ1 to the drive pulse output signal φ1' due to the fact that the rise setting value in the 1st flip-flop (FF) 15 and the fall setting value in the 2nd flip-flop (FF) 16 are updated around the timing of the third cycle boundary, as presented in FIG. 12A.

Third Embodiment

Further Configuration of a Drive Pulse Output Generating Circuit

FIG. 13 is a diagram depicting a further configuration of a drive pulse output generating circuit which is a second functional module 1g of a semiconductor integrated circuit 1 according to a third embodiment.

The drive pulse output generating circuit 1g according to the third embodiment depicted in FIG. 13 differs from the drive pulse output generating circuit 1g according to the first embodiment depicted in FIG. 2 in the following point.

The drive pulse output generating circuit 1g according to the third embodiment depicted in FIG. 13 includes a 1st pulse generator 19_1 for generating a 1st drive pulse output signal φ1 which is generated from a 1st output terminal Tout1 and a 2nd pulse generator 19_2 for generating a 2nd drive pulse output signal φ2 which is generated from a 2nd output terminal Tout2.

An output terminal of a 1st comparator 17_1 and an output terminal of a 2nd comparator 18_1 are coupled to 1st and 2nd input terminals of the 1st pulse generator 19_1 respectively. An output terminal of a 3rd comparator 17_2 and an output terminal of a 4th comparator 18_2 are coupled to 1st and 2nd input terminals of the 2nd pulse generator 19_2 respectively.

An output terminal of a 1st flip-flop (FF) 15_1 and an output terminal of a 2nd flip-flop (FF) 16_1 are coupled to a 1st input terminal of the 1st comparator 17_1 and a 1st input terminal of the 2nd comparator 18_1 respectively. An output terminal of a 3rd flip-flop (FF) 15_2 and an output terminal of a 4th flip-flop (FF) 16_2 are coupled to a 1st input terminal of the 3rd comparator 17_2 and a 1st input terminal of the 4th comparator 18_2 respectively. A counter value output by a counter 14 is supplied commonly to a second input terminal of each of the 1st comparator 17_1, the 2nd comparator 18_1, the 3rd comparator 17_2, and the 4th comparator 18_2. A count maximum value Nmax for the counter 14 to count up to it can be set by a value of cycle data that is supplied from a cycle data register via a 5th flip-flop (FF) 13. Besides, cycle data that is stored in the 5th flip-flop (FF) 13 can be updated at timing when the 5th flip-flop is supplied with an update enable signal.

A 1st input terminal of the 1st flip-flop (FF) 15_1 and a 1st input terminal of the 2nd flip-flop (FF) 16_1 are coupled to an output terminal of a 1st selector 1E_1 and an output terminal of a 2nd selector 1F_1 respectively. A 1st input terminal of the 3rd flip-flop (FF) 15_2 and a 1st input terminal of the 4th flip-flop (FF) 16_2 are coupled to an output terminal of a 3rd selector 1E_2 and an output terminal of a 4th selector 1F_2 respectively. An update enable signal is supplied commonly to a 2nd input terminal of each of the 1st flip-flop (FF) 15_1, the 2nd flip-flop (FF) 16_1, the 3rd flip-flop (FF) 15_2, and the 4th flip-flop (FF) 16_2.

An output terminal of a 1st rise setting register 10_1 and an output terminal of a 1st fall setting register 11_1 are coupled to a 1st input terminal of the 1st selector 1E_1 and a 1st input terminal of the 2nd selector 1F_1 respectively. An output terminal of a 2nd rise setting register 10_2 and an output terminal of a 2nd fall setting register 11_2 are coupled to a 1st input terminal of the 3rd selector 1E_2 and a 1st input terminal of the 4th selector 1F_2 respectively. Moreover, an output terminal of a rise setting flip-flop (FF) 1C_1 and an output terminal of a fall setting flip-flop (FF) 1D_1 are coupled to a 2nd input terminal of the 1st selector 1E_1 and a 2nd input terminal of the 2nd selector 1F 1 respectively. An output terminal of a rise setting flip-flop (FF) 1C_2 and an output terminal of a fall setting flip-flop (FF) 1D_2 are coupled to a 2nd input terminal of the 3rd selector 1E_2 and a 2nd input terminal of the 4th selector 1F_2 respectively.

A 1st input terminal In1, a 2nd input terminal Int, and a 3rd input terminal In3 of a phase arithmetic circuit 1A are supplied with a phase angle change value from a phase adjustment register 1B, cycle data from a cycle data register 12, and rise setting count/fall setting count values from setting registers 101, 102, 11_1, 11_2, respectively.

A new rise setting count value and a new fall setting count value that are generated respectively from an output terminal OUT of the phase arithmetic circuit 1A are stored into the rise setting flip-flops (FFs) 1C_1, 1C_2 and the fall setting flip-flops (FFs) 1D_1, 1D_2, respectively.

According to the drive pulse output generating circuit 1g of the third embodiment depicted in FIG. 13, when generating a plurality of drive pulse output signals φ1, φ2, it is possible to make shared use of the phase adjustment register 1B storing a phase angle change value, the cycle data register 12 storing cycle data, the phase arithmetic circuit 1A executing phase arithmetic operation, and the counter 14 counting up. Owing to this shared use, it is therefore possible to reduce the area occupied by the semiconductor chip of the semiconductor integrated circuit 1 according to the third embodiment and power consumption by the semiconductor integrated circuit 1.

While the invention made by the present inventors has been described specifically based on its different embodiments hereinbefore, it will be obvious that the present invention is not limited to the described embodiments and various modifications may be made without departing from the scope of the invention.

For example, pulse output signals generated by the semiconductor integrated circuit according to the present invention are not limited only to driving a traveling wave type ultrasonic motor; these signals can also be applied to driving a pulse motor such as a stepping motor.

What is claimed is:

1. A semiconductor integrated circuit comprising a central processing unit, a built-in memory, and a pulse generating circuit, the pulse generating circuit comprising a rise setting register, a fall setting register, a phase adjustment data register, a cycle data register, a phase arithmetic circuit, a counter, a 1st comparator, a 2nd comparator, and a pulse generator, wherein the counter starts to count up, incrementing its count value from a count initial value, wherein the cycle data register stores, as cycle data, a count maximum value for the counter to count up to it, wherein, when the count value of the counter has reached the count maximum value after the counter starts to count up from the count initial value, the count value of the counter returns to the count initial value again and the counter restarts to count up, wherein the rise setting register stores a rise setting count value of the counter to make a pulse output signal being generated by the pulse generator rise from a low level to a high level, wherein the fall setting register stores a fall setting count value of the counter to make a pulse output signal being generated by the pulse generator fall from the high level to the low level, wherein, in response to detection of a match occurring between the count value of the counter and the rise setting count value, detected by the 1st comparator, the pulse generator makes the pulse output signal change from the low level to the high level, wherein, in response to detection of a match occurring between the count value of the counter and the fall setting count value, detected by the 2nd comparator, the pulse generator makes the pulse output signal change from the high level to the low level, wherein the phase adjustment data register stores a phase angle change value for timing adjustment of the pulse output signal being generated by the pulse generator, wherein the phase arithmetic circuit in the pulse generating circuit comprises a digital multiplying circuit, a digital dividing circuit, a digital adding circuit, and a digital subtracting circuit, wherein the digital multiplying circuit generates a multiplication output signal by performing multiplication of the phase angle change value stored in the phase adjustment data register and the count maximum value stored in the cycle data register, wherein the digital dividing circuit generates a division output signal by dividing the multiplication output signal from the digital multiplying circuit by a phase angle for one cycle, wherein the digital adding circuit is capable of adding the division output signal from the digital dividing circuit and the rise setting count value stored in the rise setting register as well as adding the division output signal and the fall setting count value stored in the fall setting register, wherein the addition performed by the digital adding circuit generates a new rise setting count value and a new fall setting count value required to delay the phase by the phase angle change value, wherein the digital subtracting circuit is capable of subtracting the division output signal from the digital dividing circuit from the rise setting count value stored in the rise setting register as well as subtracting the division output signal from the fall setting count value stored in the fall setting register, and wherein the subtraction performed by the digital subtracting circuit generates a new rise setting count value and a new fall setting count value required to advance the phase by the phase angle change value.

2. The semiconductor integrated circuit according to claim 1,
wherein the pulse output signal being generated by the pulse generator is capable of driving a motor.

3. The semiconductor integrated circuit according to claim 2,
wherein the motor drivable by the pulse output signal being generated by the pulse generator is an ultrasonic motor.

4. The semiconductor integrated circuit according to claim 3,
wherein, when an addition output signal resulting from the addition performed by the digital adding circuit becomes larger than the count maximum value, the digital adding circuit generates a corrected addition output signal by subtracting the count maximum value from the addition output signal.

5. The semiconductor integrated circuit according to claim 4,
wherein, when a subtraction output signal resulting from the subtraction performed by the digital subtracting circuit becomes smaller than the count initial value, the digital subtracting circuit generates a corrected subtraction output signal corresponding to an absolute value of the subtraction output signal.

6. The semiconductor integrated circuit according to claim 5,
wherein the phase arithmetic circuit in the pulse generating circuit further comprises a multiplexer and a cycle overrun correction circuit,
wherein the addition output signal from the digital adding circuit and the subtraction output signal from the digital subtracting circuit are supplied to a 1st input terminal and a 2nd input terminal of the multiplexer respectively,
wherein an output signal of the multiplexer is input to an input terminal of the cycle overrun correction circuit, and
wherein the cycle overrun correction circuit has a data correction function to avoid that a low-level or high-level pulse period of the pulse output signal being generated by the pulse generator in response to an arithmetic output signal from an output terminal of the phase arithmetic circuit exceeds the one cycle of the phase angle.

7. The semiconductor integrated circuit according to claim 5,
wherein the pulse generating circuit further comprises a 1st selector, a 2nd selector, a 1st flip-flop, a 2nd flip-flop, a 3rd flip-flop, and a 4th flip-flop,
wherein the new rise setting count value is supplied from the output terminal of the phase arithmetic circuit to an input terminal of the 3rd flip-flop and the new fall setting count value is supplied from the output terminal of the phase arithmetic circuit to an input terminal of the 4th flip-flop,
wherein the rise setting count value stored in the rise setting register and the fall setting count value stored in the fall setting register can be supplied to a 1st input terminal of the 1st selector and a 1st input terminal of the 2nd selector respectively,
wherein the new rise setting count value from an output terminal of the 3rd flip-flop and the new fall setting count value from an output terminal of the 4th flip-flop can be supplied to a 2nd input terminal of the 1st selector and a 2nd input terminal of the 2nd selector respectively,
wherein the rise setting count value stored in the rise setting register and the new rise setting count value from the output terminal of the 3rd flip-flop, which are output to an output terminal of the 1st selector, can be supplied to an input terminal of the 1st flip-flop,
wherein the fall setting count value stored in the fall setting register and the new fall setting count value from the output terminal of the 4th flip-flop, which are output to an output terminal of the 2nd selector, can be supplied to an input terminal of the 2nd flip-flop,
wherein an output terminal of the 1st flip-flop and an output terminal of the 2nd flip-flop are coupled to a 1st input terminal of the 1st comparator and a 1st input terminal of the 2nd comparator respectively, and
wherein the count value of the counter is supplied to a 2nd input terminal of the 1st comparator and a 2nd input terminal of the 2nd comparator.

8. The semiconductor integrated circuit according to claim 5,
wherein the phase angle change value given in hexadecimal having a sign bit as the most significant bit is stored in the phase adjustment data register.

9. The semiconductor integrated circuit according to claim 8,
wherein the central processing unit stores the phase angle change value given in hexadecimal into the phase adjustment data register by executing control software for the motor stored in the built-in memory.

10. The semiconductor integrated circuit according to claim 7,
wherein the pulse generating circuit further comprises a 5th flip-flop,
wherein the count maximum value stored in the cycle data register is supplied to an input terminal of the 5th flip-flop and an output terminal of the 5th flip-flop is coupled to the counter, and
wherein, in response to an update enable signal, when having been supplied to a control terminal of each of the 1st, 2nd, and 5th flip-flops, the 1st, 2nd, and 5th flip-flops stores a setting value from the output terminal of the 1st selector, a setting value from the output terminal of the 2nd selector, and a setting value in the cycle data register, respectively.

11. The semiconductor integrated circuit according to claim 10,
wherein the pulse generating circuit further comprises an AND circuit and an update timing control circuit,
wherein the update enable signal is transferred via a 1st input terminal and an output terminal of the AND circuit to the control terminal of each of the 1st, 2nd, and 5th flip-flops,
wherein an output signal of the 1st comparator and an output signal of the 2nd comparator are supplied to a 1st input terminal and a 2nd input terminal of the update timing control circuit respectively,
wherein an output signal of the 1st flip-flop, an output signal of the 2nd flip-flop, and an output signal of the 3rd flip-flop are supplied to a 3rd input terminal, a 4th input terminal, and a 5th input terminal of the update timing control circuit respectively, and wherein the update timing control circuit generates a mask signal that is supplied to a 2nd input terminal of the AND circuit and the mask signal prevents the pulse output signal being generated by the pulse generator from having an abnormally long high-level period and an abnormally short low-level period.

12. The semiconductor integrated circuit according to claim 5, wherein the pulse generating circuit further comprises a 2nd rise setting register, a 2nd fall setting register, a 3rd comparator, a 4th comparator, and a 2nd pulse generator, wherein the 2nd rise setting register stores a 2nd rise setting count value of the counter to make a 2nd pulse output signal being generated by the 2nd pulse generator rise from a low level to a high level, wherein the 2nd fall setting register stores a 2nd fall setting count value of the counter to make a 2nd pulse output signal being generated by the 2nd pulse generator fall from the high level to the low level, wherein, in response to detection of a match occurring between the count value of the counter and the 2nd rise setting count value, detected by the 3rd comparator, the 2nd pulse generator makes the 2nd pulse output signal change from the low level to the high level, and wherein, in response to detection of a match occurring between the count value of the counter and the 2nd fall setting count value, detected by the 4th comparator, the 2nd pulse generator makes the 2nd pulse output signal change from the high level to the low level.

13. An operation method of a semiconductor integrated circuit comprising s a central processing unit, a built-in memory, and a pulse generating circuit, the pulse generating circuit comprising a rise setting register, a fall setting register, a phase adjustment data register, a cycle data register, a phase arithmetic circuit, a counter, a 1st comparator, a 2nd comparator, and a pulse generator, wherein the counter starts to count up, incrementing its count value from a count initial value, wherein the cycle data register stores, as cycle data, a count maximum value for the counter to count up to it, wherein, when the count value of the counter has reached the count maximum value after the counter starts to count up from the count initial value, the count value of the counter returns to the count initial value again and the counter restarts to count up, wherein the rise setting register stores a rise setting count value of the counter to make a pulse output signal being generated by the pulse generator rise from a low level to a high level, wherein the fall setting register stores a fall setting count value of the counter to make a pulse output signal being generated by the pulse generator fall from the high level to the low level, wherein, in response to detection of a match occurring between the count value of the counter and the rise setting count value, detected by the 1st comparator, the pulse generator makes the pulse output signal change from the low level to the high level, wherein, in response to detection of a match occurring between the count value of the counter and the fall setting count value, detected by the 2nd comparator, the pulse generator makes the pulse output signal change from the high level to the low level, wherein the phase adjustment data register stores a phase angle change value for timing adjustment of the pulse output signal being generated by the pulse generator, wherein the phase arithmetic circuit in the pulse generating circuit comprises a digital multiplying circuit, a digital dividing circuit, a digital adding circuit, and a digital subtracting circuit, wherein the digital multiplying circuit generates a multiplication output signal by performing multiplication of the phase angle change value stored in the phase adjustment data register and the count maximum value stored in the cycle data register, wherein the digital dividing circuit generates a division output signal by dividing the multiplication output signal from the digital multiplying circuit by a phase angle for one cycle, wherein the digital adding circuit is capable of adding the division output signal from the digital dividing circuit and the rise setting count value stored in the rise setting register as well as adding the division output signal and the fall setting count value stored in the fall setting register, wherein the addition performed by the digital adding circuit generates a new rise setting count value and a new fall setting count value required to delay the phase by the phase angle change value, wherein the digital subtracting circuit is capable of subtracting the division output signal from the digital dividing circuit from the rise setting count value stored in the rise setting register as well as subtracting the division output signal from the fall setting count value stored in the fall setting register, and wherein the subtraction performed by the digital subtracting circuit generates a new rise setting count value and a new fall setting count value required to advance the phase by the phase angle change value.

14. The operation method of the semiconductor integrated circuit according to claim 13, wherein the pulse output signal being generated by the pulse generator is capable of driving a motor.

15. The operation method of the semiconductor integrated circuit according to claim 14, wherein the motor drivable by the pulse output signal being generated by the pulse generator is an ultrasonic motor.

16. The operation method of the semiconductor integrated circuit according to claim 15, wherein, when an addition output signal resulting from the addition performed by the digital adding circuit becomes larger than the count maximum value, the digital adding circuit generates a corrected addition output signal by subtracting the count maximum value from the addition output signal.

17. The operation method of the semiconductor integrated circuit according to claim 16, wherein, when a subtraction output signal resulting from the subtraction performed by the digital subtracting circuit becomes smaller than the count initial value, the digital subtracting circuit generates a corrected subtraction output signal corresponding to an absolute value of the subtraction output signal.

18. The operation method of the semiconductor integrated circuit according to claim 17, wherein the phase arithmetic circuit in the pulse generating circuit further comprises a multiplexer and a cycle overrun correction circuit, wherein the addition output signal from the digital adding circuit and the subtraction output signal from the digital subtracting circuit are supplied to a 1st input terminal and a 2nd input terminal of the multiplexer respectively, wherein an output signal of the multiplexer is input to an input terminal of the cycle overrun correction circuit, and wherein the cycle overrun correction circuit has a data correction function to avoid that a low-level or high-level pulse period of the pulse output signal being generated by the pulse generator in response to an arithmetic output signal from an output terminal of the phase arithmetic circuit exceeds the one cycle of the phase angle.

19. The operation method of the semiconductor integrated circuit according to claim 17, wherein the pulse generating circuit further comprises a 1st selector, a 2nd selector, a 1st flip-flop, a 2nd flip-flop, a 3rd flip-flop, and a 4th flip-flop, wherein the new rise setting count value is supplied from the output terminal of the phase arithmetic circuit to an input terminal of the 3rd flip-flop and the new fall setting count value is supplied from the output terminal of the phase arithmetic circuit to an input terminal of the 4th flip-flop, wherein the rise setting count value stored in the rise setting register and the fall setting count value stored in the fall setting register can be supplied to a 1st input terminal of the 1st selector and a 1st input terminal of the 2nd selector respectively, wherein the new rise setting count value from an output terminal of the 3rd flip-flop and the new fall setting count value from an output terminal of the 4th flip-flop can be supplied to a 2nd input terminal of the 1st selector and a 2nd input terminal of the 2nd selector respectively, wherein the rise setting count value stored in the rise setting register and the new rise setting count value from the output terminal of the 3rd flip-flop, which are output to an output terminal of the 1st selector, can be supplied to an input terminal of the 1st flip-flop, wherein the fall setting count value stored in the fall setting register and the new fall setting count value from the output terminal of the 4th flip-flop, which are output to an output terminal of the 2nd selector, can be supplied to an input terminal of the 2nd flip-flop, wherein an output terminal of the 1st flip-flop and an output terminal of the 2nd flip-flop are coupled to a 1st input terminal of the 1st comparator and a 1st input terminal of the 2nd comparator respectively, and wherein the count value of the counter is supplied to a 2nd input terminal of the 1st comparator and a 2nd input terminal of the 2nd comparator.

20. The operation method of the semiconductor integrated circuit according to claim 17, wherein the phase angle change value given in hexadecimal having a sign bit as the most significant bit is stored in the phase adjustment data register.

* * * * *